United States Patent
Kamieniecki

(10) Patent No.: US 8,232,817 B2
(45) Date of Patent: Jul. 31, 2012

(54) APPARATUS AND METHOD FOR ELECTRICAL CHARACTERIZATION BY SELECTING AND ADJUSTING THE LIGHT FOR A TARGET DEPTH OF A SEMICONDUCTOR

(75) Inventor: Emil Kamieniecki, Bedford, MA (US)

(73) Assignee: Nanometrics Incorporated, Milpitas, CA (US)

( * ) Notice: Subject to any disclaimer, the term of this patent is extended or adjusted under 35 U.S.C. 154(b) by 126 days.

(21) Appl. No.: 12/700,564

(22) Filed: Feb. 4, 2010

(65) Prior Publication Data

US 2010/0156445 A1    Jun. 24, 2010

Related U.S. Application Data

(62) Division of application No. 10/547,153, filed on Apr. 25, 2007, now Pat. No. 7,663,385.

(60) Provisional application No. 60/433,382, filed on Dec. 13, 2002.

(51) Int. Cl.
*G01R 31/302* (2006.01)
(52) U.S. Cl. .............................. 324/754.23; 324/762.01
(58) Field of Classification Search .................... None
See application file for complete search history.

(56) References Cited

U.S. PATENT DOCUMENTS

| 3,809,953 | A | | 5/1974 | Nishizawa |
|---|---|---|---|---|
| 4,563,642 | A | | 1/1986 | Munakata et al. |
| 4,891,584 | A | | 1/1990 | Kamieniecki et al. |
| 4,968,932 | A | * | 11/1990 | Baba et al. ............... 324/754.21 |
| 5,025,145 | A | | 6/1991 | Lagowski |
| 5,087,876 | A | | 2/1992 | Reiss et al. |
| 5,091,691 | A | | 2/1992 | Kamieniecki et al. |
| 5,453,703 | A | | 9/1995 | Goldfarb |
| 5,581,194 | A | * | 12/1996 | Lowell ..................... 324/754.23 |
| 5,663,975 | A | | 9/1997 | Yoshida et al. |
| 5,696,583 | A | * | 12/1997 | Yoon .............................. 356/497 |
| 5,750,981 | A | | 5/1998 | Fonash |
| 6,005,400 | A | | 12/1999 | Thundat et al. |
| 6,034,535 | A | | 3/2000 | Liberman et al. |
| 6,049,220 | A | * | 4/2000 | Borden et al. ........... 324/754.23 |
| 6,069,017 | A | | 5/2000 | Kamieniecki et al. |
| 6,097,205 | A | * | 8/2000 | Liberman et al. ........ 324/754.23 |
| 6,323,951 | B1 | * | 11/2001 | Borden et al. ................. 356/502 |
| 6,426,644 | B1 | * | 7/2002 | Borden et al. ........... 324/754.23 |
| 6,483,594 | B2 | * | 11/2002 | Borden et al. ................. 356/502 |
| 6,663,975 | B1 | | 12/2003 | Toyosawa et al. |

(Continued)

FOREIGN PATENT DOCUMENTS

JP    58108752 A    6/1983

(Continued)

*Primary Examiner* — Paresh Patel
(74) *Attorney, Agent, or Firm* — Silicon Valley Patent Group LLP

(57) ABSTRACT

The present disclosure provides methods and apparatus that enable characterization of an electrical property of a semiconductor specimen, e.g., dopant concentration of a near-surface region of the specimen. In exemplary method, a target depth for measurement is selected. This thickness may, for example, correspond to a nominal production thickness of a thin active device region of the specimen. A light is adjusted to an intensity selected to characterize a target region of the specimen having a thickness no greater than the target depth and a surface of the specimen is illuminated with the light. An AC voltage signal induced in the specimen by the light is measured and this AC voltage may be used to quantify an aspect of the electrical property, e.g., to determine dopant concentration, of the target region.

17 Claims, 14 Drawing Sheets

U.S. PATENT DOCUMENTS

| | | |
|---|---|---|
| 6,750,661 B2 | 6/2004 | Brooks et al. |
| 7,663,385 B2 | 2/2010 | Kamieniecki |

FOREIGN PATENT DOCUMENTS

| | | |
|---|---|---|
| JP | 58166762 A | 10/1983 |
| JP | 58206133 A | 12/1983 |
| JP | 61044437 A | 3/1986 |
| JP | 61271850 A | 12/1986 |
| WO | WO-2004/055528 A2 | 7/2004 |
| WO | WO-2004/055528 A3 | 7/2004 |

\* cited by examiner

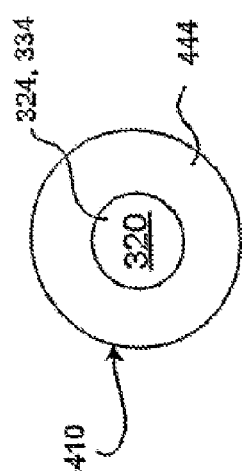
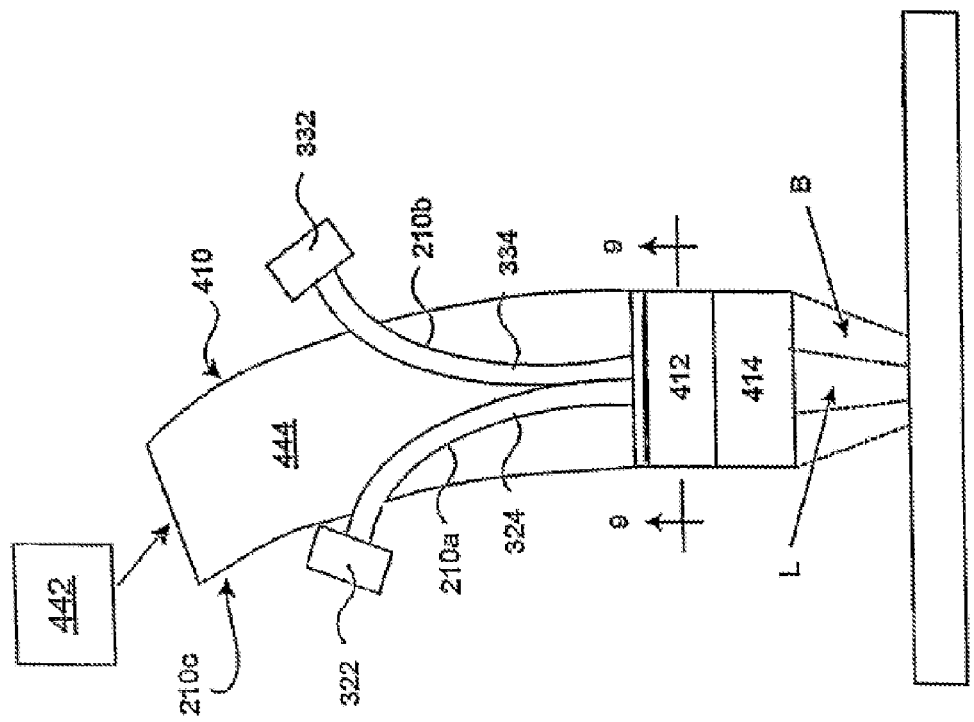
FIG. 9
FIG. 8

APPARATUS AND METHOD FOR ELECTRICAL CHARACTERIZATION BY SELECTING AND ADJUSTING THE LIGHT FOR A TARGET DEPTH OF A SEMICONDUCTOR

CROSS REFERENCE TO RELATED APPLICATION

This application is a divisional of U.S. patent application Ser. No. 10/547,153, filed Apr. 25, 2007, now U.S. Pat. No. 7,663,385 entitled "Apparatus and Method for Electrical Characterization by Selecting and Adjusting the Light for a Target Depth of a Semiconductor," which claims the benefit of U.S. Provisional Application No. 60/433,382, filed Dec. 13, 2002, and application Ser. No. 10/547,153 also claims priority to international patent application No. PCT/US03/40069, filed Dec. 15, 2003, all of which are incorporated herein by reference in their entirety.

FIELD OF THE INVENTION

The present invention generally relates to semiconductor manufacture. Aspects of the invention have particular utility in connection with characterization of semiconductors, e.g., determining electrical characteristics of a near-surface region of a semiconductor.

Bibliography

A number of patents discuss the use of surface photovoltage (SPV) measurements to measure or characterize properties of semiconductors. These patents include:

U.S. Pat. No. 4,544,887 (issued 1 Oct. 1985 to E. Kamieniecki) discloses a method of measuring the photo-induced voltage at the surface of a specimen of semiconductor material;

U.S. Pat. No. 4,827,212 (issued 2 May 1989 to E. Kamieniecki) discloses a method and apparatus for characterizing a semiconductor using the surface photovoltage effect;

U.S. Pat. No. 4,891,584 (issued 2 Jan. 1990 to E. Kamieniecki, W. C. Goldfarb, and M. Wollowitz) discloses an apparatus for making AC surface photovoltage measurements of a specimen of semiconductor material under DC bias voltage conditions;

U.S. Pat. No. 5,087,876 (issued 11 Feb. 1992 to L. Reiss and E. Kamieniecki) discloses an apparatus for making AC surface photovoltage measurements of a specimen of semiconductor material under variable DC bias voltage conditions;

U.S. Pat. No. 5,091,691 (issued 25 Feb. 1992 to E. Kamieniecki, W. C. Goldfarb, and M. Wollowitz) discloses an apparatus for making AC surface photovoltage measurements of a specimen of semiconductor material under DC bias voltage conditions;

U.S. Pat. No. 5,661,408 (issued 26 Aug. 1997 to E. Kamieniecki and J. Ruzyllo) discloses an apparatus and method for the real-time, in-line testing of semiconductor wafers during the manufacturing process;

U.S. Pat. No. 6,069,017 (issued 30 May 2000 to E. Kamieniecki and J. Ruzyllo) discloses an apparatus and method for the real-time, in-line testing of semiconductor wafers during the manufacturing process;

U.S. Pat. No. 6,315,574 (issued 13 Nov. 2001 to E. Kamieniecki and J. Ruzyllo) discloses an apparatus and method for the real-time, in-line testing of semiconductor wafers during the manufacturing process;

U.S. Pat. No. 6,326,220 B1 (issued 4 Dec. 2001 to W-W. Chen, Y-L Hwang and Y-C Yang) discloses a method for determining near-surface doping concentration by utilizing surface photovoltage;

U.S. Patent Application No. 2002/0006740 (published 17 Jan. 2002 to E. Kamieniecki and J. Ruzyllo) discloses an apparatus and method for the real-time, in-line testing of semiconductor wafers during the manufacturing process.

Other known publications relating to surface photovoltage (SPV) measurements of semiconductors include: Dieter K. Schroder, "Semiconductor Material and Device Characterization," John Wiley & Sons, Inc., New York 1990, Chapter 2;

E. Kamieniecki, "In-Line Process Monitoring in Advanced IC Manufacturing," ECS-ALTECH 99, and "Analytical and Diagnostic Techniques for Semiconductor Materials, Devices, and Processes," ECS 1999, ECS Proceedings Vol. 99-16; SPIE Vol. 3895, pp. 259-270;

R. S. Nakhmanson, "Frequency Dependence of the Photo-EMF of Strongly Inverted Ge and Si MIS Structures-I. Theory," Solid State Electronics, Vol. 18, 1975, pp. 617-626;

R. S. Nakhmanson, Z. Sh. Ovsyuk, and L. K. Popov, "Frequency Dependence of Photo-EMF of Strongly Inverted Ge and Si MIS Structures-II. Experiments," Solid State Electronics, Vol. 18, 1975, pp. 627-634;

R. L. Streever, J. J. Winter, and F. Rothwarf, "Photovoltage Characterization of MOS Capacitors," Proc. Int. Symp. Silicon Materials Sci. & Tech., Philadelphia, May 1977, (Electrochem. Soc. Princeton, 1977) pp. 393-400;

A. Sher, Y. H. Tsuo, J. A. Moriarty, W. E. Miller, and R. K. Crouch, "Si and GaAs Photocapacitive MIS Infrared Detectors," J. Appl. Phys., Vol. 51, No. 4, April 1980, pp. 2137-2148;

Chusuke Munakata, Mitsuo Nanba and Sunao Matsubara, "Non-Destructive Method of Observing Inhomogeneities in p-n Junctions with a Chopped Photon Beam," Jpn. J. Appl. Phys., Vol. 20, No. 2, February 1981, pp. L137-L140;

E. Kamieniecki, "Determination of Surface Space Charge Using a Light Probe," J. Vac. Sci. Technol., Vol. 20, No. 3, March 1982, pp. 811-814;

E. Kamieniecki and G. Parsons, "Characterization of Semiconductor-Electrolyte System by Surface Photovoltage Measured Capacitance," 164th Meeting of the Electrochemical Society, Washington, D.C., October 1983, The Electrochemical Society, Extended Abstracts, Vol. 83-2, p. 561;

E. Kamieniecki, "Surface Photovoltage Measured Capacitance: Application To Semiconductor/Electrolyte System," J. Appl. Phys., Vol. 54, No. 11, November 1983, pp. 6481-6487;

O. Engstrom and A. Carlsson, "Scanned Light Pulse Technique for the Investigation of Insulator-semiconductor Interfaces," J. Appl. Phys., Vol. 54, No. 9, September 1983, pp. 5245-5251;

E. Thorngren and O. Engstrom, "An Apparatus for the Determination of Ion Drift in MIS Structures," J. Phys. E: Sci. Instrum., Vol. 17, 1984, pp. 1114-1116; Chusuke Munakata, Shigeru Nishimatsu, Noriaki Honma and Kunihiro Yagi, "AC Surface Photovoltages in Strongly-Inverted Oxidized p-Type Silicon Wafers," Jpn. J. Appl. Phys., Vol. 23, No. 11, November 1984, pp. 1451-1461;

Chusuke Munakata and Shigeru Nishimatsu, "Analysis of AC Surface Photovoltages in a Depleted Oxidized p-Type Silicon Wafer," Jpn. J. Appl. Phys., Vol. 25, No. 6, June 1986, pp. 807-812;

Hiromichi Shimizu, Kanji Kinameri, Noriaki Honma, and Chusuke Munakata, "Determination of Surface Charge and Interface Trap Densities in Naturally Oxidized n-Type Si Wafers Using AC Surface Photovoltages," Jpn. J. Appl. Phys., Vol. 26, No. 2, February 1987, pp. 226-230;

E. Kamieniecki, "Surface Charge Analysis: A New Method to Characterize Semiconductor/Insulator Structures—Application to Silicon/Oxide System," Proceedings of the 1st International Symposium on Cleaning Technology in Semiconductor Device Manufacturing, Hollywood, Fla., October 1989, Vol. 90-9, pp. 273-279;

E. Kamieniecki and G. Foggiato, "Analysis and Control of Electrically Active Contaminants by Surface Charge Analysis," Handbook of Semiconductor Wafer Cleaning Technology, Part IV-11, Ed. W. Kern, Noyes Publications (1993); and D. Marinskiy, J. Lagowski, M. Wilson, L. Jastrzebski, R. Santiesteban, and Kim Elshot, Small Signal ac-Surface Photovoltage Technique for Non-Contact Monitoring of Near Surface Doping for IC-processing," In Process Control and Diagnostics, Michael L. Miller, Kaihan A. Ashtiani, Editors, Proceedings of SPIE Vol. 4182 (2000), pp. 72-77.

BACKGROUND

The performance of an integrated circuit depends in part on the electrical properties of materials defining the circuit. One important region for many integrated circuits is the "active device region," which is located close to the surface, e.g., of a semiconductor wafer. With increasing complexity of integrated circuits, this active device region may be formed by depositing a high quality film, typically an epitaxial layer, of the same material as the substrate (e.g., Si) or a compatible material such as SiGe (silicon-germanium). The top layer could also be a strain layer (strain silicon) or a film formed on an insulator (e.g., silicon-on-insulator or "SOI"). Such films may even be separated from the substrate by an air gap (e.g., "silicon-on-nothing" or "SON"). The thickness of the active device region scales with dimensions of the devices forming the integrated circuits. Smaller devices, which are required by the increasing density of integrated circuits, generally require a thinner active device region and a thinner high quality film or layer in which these devices are formed. Many advanced integrated circuits employ films that are no more than about 400 nm thick, with some of them having a thickness of 100 nm or less; such films are sometimes referred to herein as "thin active films."

Achieving respectable manufacturing yields when using thin active films requires reliable information regarding the electrical properties of the thin active film. Electrical properties of the near-surface region of semiconductor materials are conventionally measured using capacitance vs. voltage (C-V) measurements. As schematically illustrated in FIG. 1, a small AC voltage $V_{AC}$ is applied to the semiconductor device 20, which is typified in FIG. 1 as a metal-oxide-semiconductor capacitor or "MOS-C," using a measurement circuit 10. The measured current $J_m$ may be used in a known fashion to determine the capacitance of the surface space-charge region. Simultaneously applied DC voltage VDC may be varied to modify this space-charge region and determine various electrical characteristics, including doping concentration. However, the C-V techniques cannot accurately measure the near-surface resistivity profile to less than about 2 to 3 Debye lengths from the surface (more than 500 nm for 10 ohm-cm silicon). (Dieter K. Schroder, "Semiconductor Material and Device Characterization," John Wiley & Sons, Inc., New York 1990, Chapter 2). Measurements of average doping in the near-surface region are possible by so-called "Maximum-Minimum MOS-C Capacitance." This method compares a maximum capacitance and a minimum capacitance for the tested specimen, which are achieved by applying the appropriate high electrical DC bias. Unfortunately, if this approach is used for non-contact measurements using an air gap, for example, the requisite electrical field can be high enough to cause electrical breakdown of and surface damage to the tested specimen.

Some known alternatives to the C-V technique are based on the surface photovoltage (SPV) effect described in U.S. Pat. Nos. 4,544,887; 4,827,212; 4,891,584; 5,087,876; 5,091,691; and 5,661,408, for example. These approaches are also extensively discussed in a number of publications, e.g., E. Kamieniecki, 1999; R. S. Nakhmanson, 1975; R. S. Nakhmanson at al., 1975; R. L. Streever at al., 1977; A. Sher at al., 1980; Ch. Munakata at al., 1981; E. Kamieniecki, 1982; E. Kamieniecki at al., 1983; E. Kamieniecki, 1983; O. Engstrom at al., 1983; E. Thorngren at al., 1984; Ch. Munakata at al., 1984; Ch. Munakata at al., 1984; H. Shimizu, 1987; E. Kamieniecki, 1989; E. Kamieniecki at al., 1993; and D. Marinskiy at al., 2000 (each of which is identified in the preceding bibliography). Currently, SPV techniques for measuring near-surface doping concentration use the surface photovoltage induced by an intensity modulated (or "chopped"), low-intensity, short-wavelength light beam (shown schematically as L in FIG. 2). This light beam L illuminates the semiconductor surface through a transparent, electrically conductive electrode 30 that is separated from the surface of the specimen 20 by a fraction of a millimeter. A near-surface depleted region D of the measured semiconductor is under depletion conditions, i.e., is depleted of majority carriers (electrons in n-type semiconductors and holes in p-type semiconductors). In some applications, the surface may also be strongly inverted, i.e., with minority carriers present at the surface. The depletion or depletion and inversion is achieved by forming a surface charge 25 of polarity corresponding to the majority carriers, as illustrated schematically in FIG. 3 for a p-type semiconductor 20. This charge could be associated with the natural state of the surface or it could be deposited, e.g., by corona charging. The electrical field in the semiconductor due to the surface charge repels majority carriers, leaving the depletion region D adjacent the surface.

The photon energy of the light beam L impinging on the semiconductor (FIG. 2) typically exceeds the energy gap of the semiconductor 20, which generates excess electron-hole pairs in the near-surface region. The electrical field present in the near-surface region causes excess minority carriers 26 (electrons in p-type semiconductors) to accumulate at the surface. The low-intensity, intensity modulated illumination plays a role analogous to that of AC voltage in a C-V technique. By keeping light intensity low enough, the charge from the accumulated carriers 26 caused by the light is much smaller than the pre-existing surface charge 25. As a result, the width of the depletion region D is not materially affected. An alternating current surface photovoltage (AC-SPV) generated with such low-intensity light is proportional to the dark (equilibrium) width of the depletion layer D (which, in turn, is proportional to the reciprocal of the space charge capacitance). This signal can be used as an equivalent of electrically measured capacitance. (See, e.g., U.S. Pat. No. 4,544,887.) If a near-surface region is depleted but the surface is not inverted, surface traps will substantially reduce accuracy of doping concentration measurements. With knowledge of the maximum depletion layer width (inverted conditions) under thermal equilibrium, typically determined empirically, one may determine the average doping concentration in the depletion region, similarly to the "Maximum-Minimum MOS-C Capacitance" method.

As noted above, thin active films in state-of-the-art semiconductor devices may have a thickness of 100 nm or less. Unfortunately, the maximum width of the depletion layer $D_0$ under thermal equilibrium conditions may substantially exceed the thickness of a region of interest. For example, the width of the depletion region $D_0$ may exceed, by an order of magnitude or more, the thickness of an active device region formed, e.g., by ion implantation in a near-surface region of silicon, in a thin active film of silicon epitaxial layer, in SiGe, in strain silicon, or in silicon-on-insulator (SOI).

Hence, conventional metrology techniques cannot effectively evaluate thin active films, which are a central part of next-generation integrated circuits. In the absence of a reliable, flexible metrology system, manufacturers likely will encounter poor yields of functioning devices with thin active films, driving up costs.

BRIEF DESCRIPTION OF THE DRAWINGS

FIG. 8 schematically illustrates selected portions of a semiconductor characterization system in accordance with still another embodiment of the invention.

FIG. 9 is a schematic cross-sectional view taken along line 9-9 of FIG. 8.

DETAILED DESCRIPTION

Overview

Figure 1:
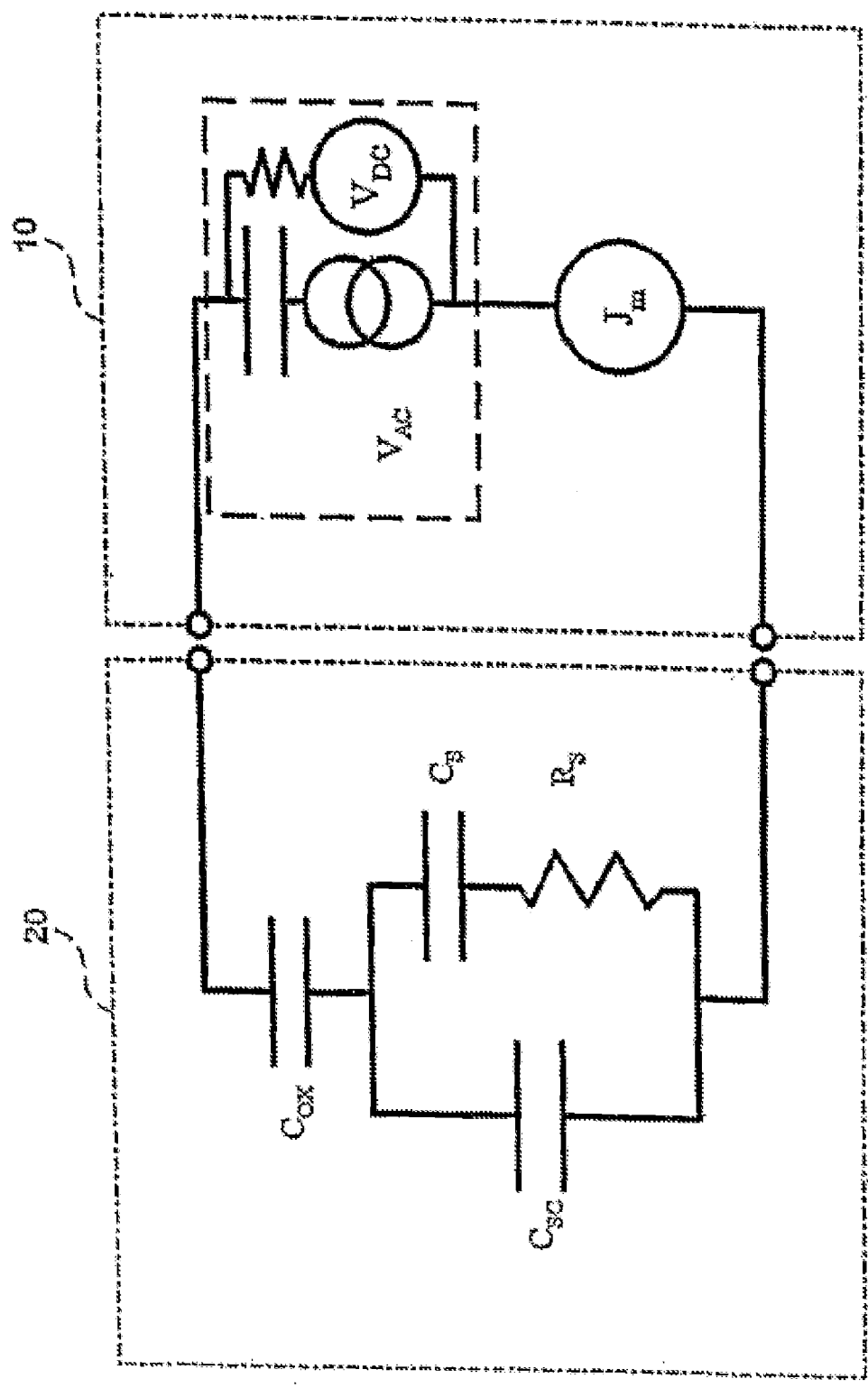
FIG. 1 schematically illustrates a conventional system for determining surface characteristics using capacitance-voltage measurements.
Figure 2:
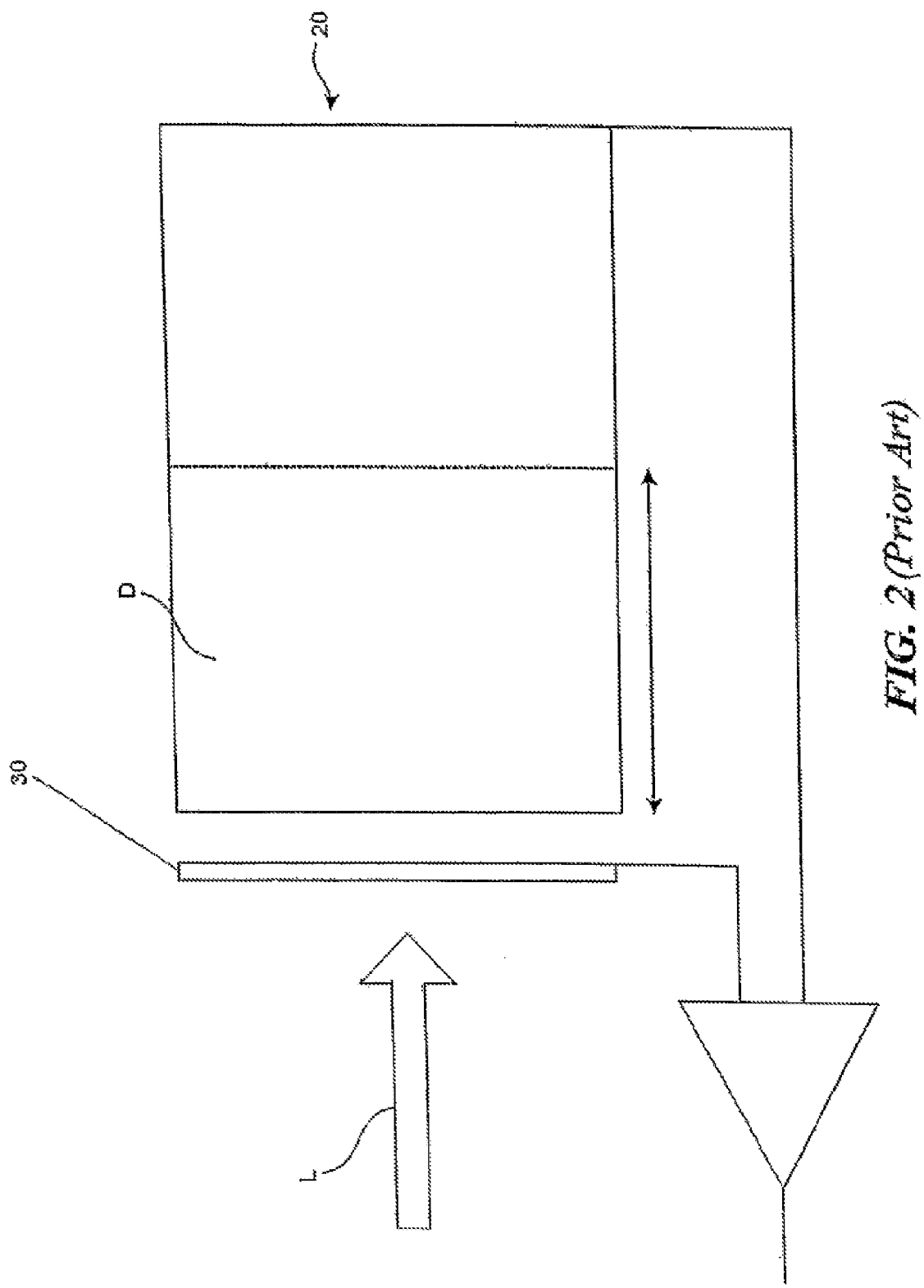
FIG. 2 schematically illustrates a conventional system used to measure surface characteristics employing surface photovoltage effects.
Figure 3:
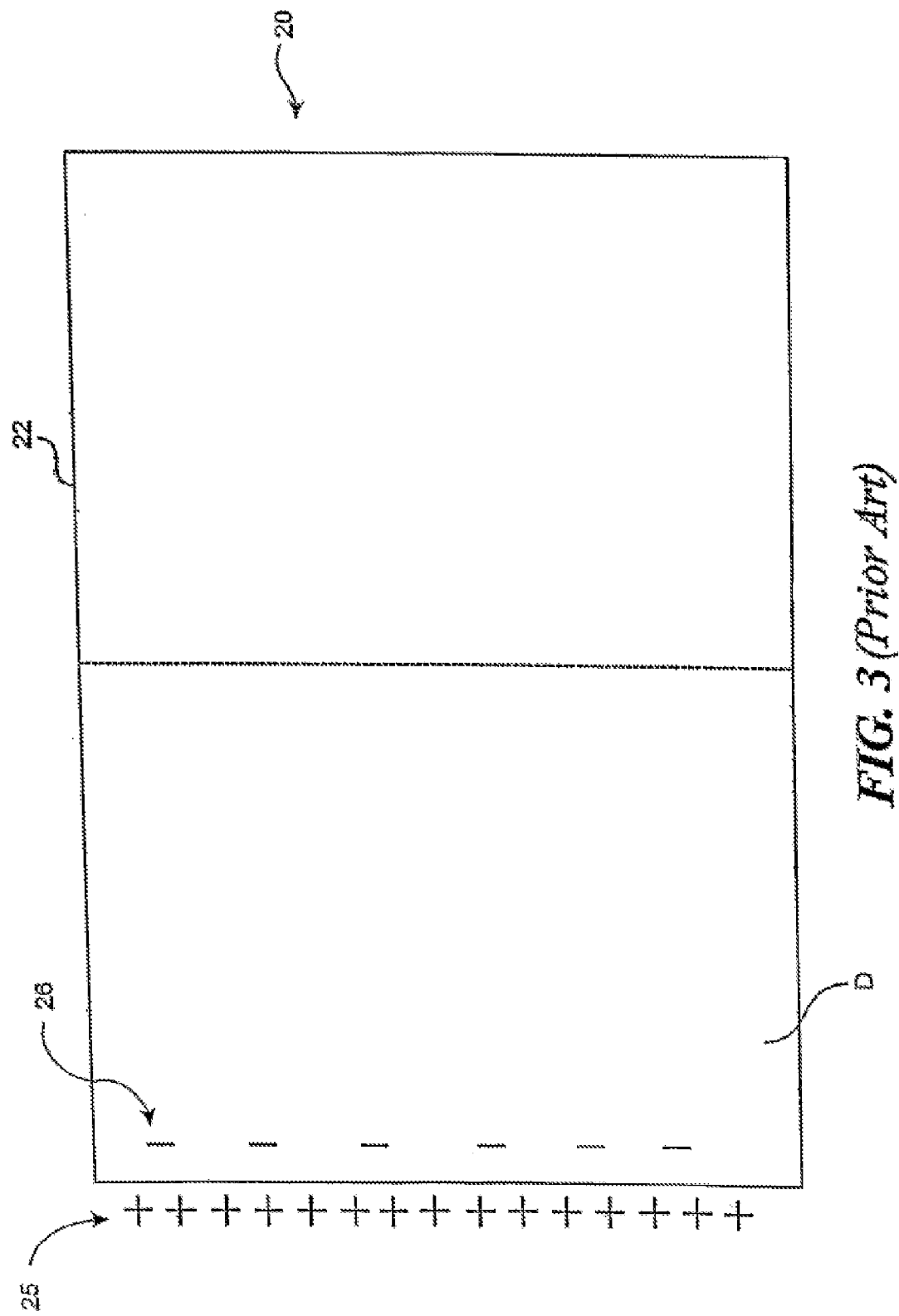
FIG. 3 schematically illustrates a semiconductor having a near-surface depleted region.

Various embodiments of the present invention provide apparatus and methods for determining select electrical characteristics of semiconductors. The following text discusses aspects of the invention in connection with FIGS. 1-18 to provide a thorough understanding of particular embodiments. A person skilled in the art will understand, however, that the invention may have additional embodiments, or that the invention may be practiced without several of the details of the embodiments shown in FIGS. 1-18.

One embodiment of the invention provides a method of characterizing an aspect of a semiconductor specimen. In this method, a target depth correlated to a depth of interest for the specimen is selected. A light intensity of a light that has a first component and an intensity modulated second component may be selected to characterize a target region of the specimen having a thickness no greater than the target depth. The light may be adjusted to the selected light intensity by varying at least the first component of the light and a target area of a surface of the specimen may be illuminated with the adjusted light. An AC voltage signal (which is associated with an aspect of the target region of the specimen) induced in the specimen by the light may be measured.

A method of characterizing an aspect of a semiconductor specimen in accordance with another embodiment of the invention may include charging a surface of the specimen to produce an inverted surface and a first depletion layer in a near-surface region. The first depletion layer has a width corresponding to a dark equilibrium value. The surface of the specimen may be illuminated with a light intensity sufficient to modify the depletion layer so that it has a measurement width of no greater than about 90%, e.g., 80% or less, of the dark equilibrium value. An AC voltage signal (which is associated with an aspect of the modified depletion layer) induced in the specimen by the illumination may be measured.

An alternative embodiment of the invention provides a method of characterizing an aspect of a semiconductor specimen in which a target area of a surface of the specimen with is illuminated with a light having a first component and a second component; at least the second component is intensity modulated. A first AC voltage signal (which is associated with an aspect of a first near-surface region of the specimen having a first depth) induced in the specimen by the light is measured. An intensity of the first component of the light is changed to generate modified light and the target area of the specimen surface is illuminated with the modified light. A second AC voltage signal induced in the specimen by the modified light is measured. The second AC voltage signal is associated with the aspect of a second near-surface region of the specimen having a second depth that is different from the first depth.

A method of measuring an electrical property of a semiconductor specimen in a further embodiment includes illuminating a target area of a surface of the specimen with a first light having a first light profile to establish a first depletion layer having a first width. An intensity of at least a portion of the first light is modulated and a first AC voltage signal induced in the specimen by the first light is measured. The first AC voltage signal is associated with an electrical property of the first depletion layer. The target area of the specimen surface may be illuminated with a second light having a second light profile to establish a second depletion layer having a second width. The second width differs from the first width. (The first and second lights may be, and in most embodiments will be, generated from the same light source or sources by varying an aspect of the source(s).) An intensity of at least a portion of the second light is modulated and a second AC voltage signal induced in the specimen by the second light is measured. The second AC voltage signal is associated with an electrical property of the second depletion layer.

Still another embodiment provides an apparatus for determining an electrical property of a semiconductor specimen. The apparatus generally includes a light source, an electrode, and a programmable controller. The light source is configured to deliver light comprising a first component and a second component; the second component is intensity modulated. The light source is positioned for juxtaposition with a surface of the semiconductor specimen to illuminate a target area of the surface. The electrode is disposed between the light source and the surface of the specimen. The controller is programmed to selectively vary an intensity of the first component from a first intensity to a second intensity; receive a first signal corresponding to a voltage between the first electrode and the second electrode when the first component is at the first intensity; receive a second signal corresponding to a voltage between the first electrode and the second electrode when the first component is at the second intensity; and determine an electrical property of a portion of a near-surface region of the semiconductor specimen by comparing the first and second signals.

For ease of understanding, the following discussion is subdivided into three areas of emphasis. The first section discusses aspects of semiconductor characterization systems in accordance with some embodiments of the invention. The second section outlines semiconductor characterization methods in accordance with other embodiments of the invention. The third section explains a suitable methodology for quantifying a dopant concentration of a portion of the semiconductor.

Semiconductor Characterization Systems

Figure 4:
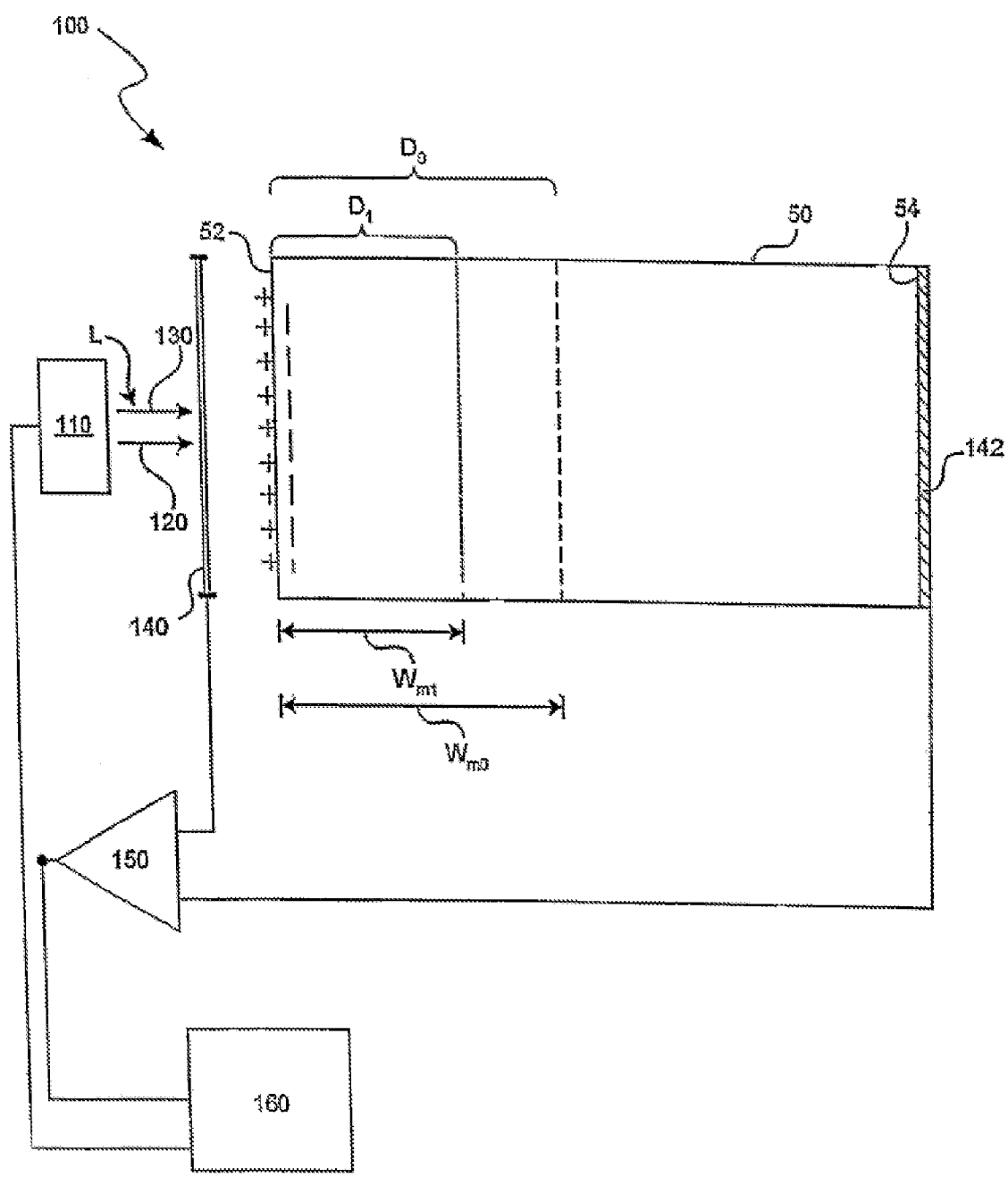
FIG. 4 schematically illustrates a semiconductor characterization system in accordance with one embodiment of the invention.

FIG. 4 schematically illustrates a semiconductor characterization system 100 in accordance with one embodiment of the invention. The surface characterization system 100 generally includes a light source 110, a first electrode 140, a second electrode 142, an amplifier 150, and a controller 160. In FIG. 4, the second electrode 142 is in direct contact with the back surface 54 of a semiconductor specimen 50 and is directly coupled to the amplifier 150. In an alternative embodiment, the system 100 may instead support the specimen with a conductive specimen holder (e.g., 202 in FIG. 5) and both the specimen holder and the second input of the amplifier may be connected to ground.

The light source 110 is positioned to direct a beam of light L through the first electrode 140 to illuminate a measured surface 52 of the specimen 50, which is schematically typified as a p-type semiconductor in FIG. 4. The measured surface of the semiconductor specimen 50 carries a surface charge having the same polarity as the majority carriers, i.e., a positive charge for the p-semiconductor specimen 50. The surface charge may be due to a natural phenomenon or induced, e.g., by depositing a corona charge. If the surface charge is high enough, an inversion layer is formed at the surface 52 and the depletion layer $D_0$ may reach a maximum equilibrium width $W_{m0}$ in the absence of any illumination by the light beam L.

Generally, the average height of the surface potential and the width of the depletion layer $D_0$ decreases under illumination by the light beam L. If the light beam L has a very low intensity, the change of the surface potential and the width of the depletion layer will be negligible, as suggested in U.S. Pat. No. 4,544,887. The AC-SPV becomes a non-linear function of the light intensity at higher intensities, though. (See, e.g., Kamieniecki, 1992, in the preceding bibliography.) The difficulties associated with this non-linear function have effectively precluded use of AC-SPV measurements from high light intensities to reliably determine electrical properties, e.g., dopant concentration, of semiconductors.

In embodiments of the invention, the light beam L has a higher intensity. In particular, the light beam may be intense enough to materially reduce the surface potential of the specimen 50 and the width $W_{m1}$ of the resultant depletion region $D_1$ from their dark equilibrium values $W_{m0}$ and $D_0$. As explained in more detail below, embodiments of the invention characterize at least one aspect of a semiconductor by selectively controlling an aspect of such a high-intensity light. For example, by controlling the intensity of a high-intensity light beam L, the width $W_{m1}$ of the depletion region $D_1$ can be selected to correspond to, or even be less than, the thickness of a layer or film of interest, such as a thin active film having a thickness of 100 nm or less. In one embodiment, light beam L will yield a depletion layer $D_1$ having a width $W_{m1}$ that is no more than 90%, e.g., 80% or less, of the dark equilibrium value of the width $W_{m0}$ of the depletion layer $D_0$. In one more particular embodiment, the intensity of the light beam L is sufficient to yield a depletion layer width $W_{m1}$ during measurement that is no great than about 50% of the dark equilibrium value $W_{m0}$. It is anticipated that select embodiments of the invention may be able to reduce this percentage to 20% or less, e.g., 10%. If so desired, the controller 160 may be coupled to the light source 110 to control the selected aspects, e.g., the intensity, of the light beam L. In some embodiments, the controller 160 may also be used to analyze signals from the amplifier 150.

Embodiments of the invention employ a light source 110 configured to generate a light beam L including a first component 120 and a second component 130. The first and second components 120 and 130 may be generated from a single common light emitter (as discussed below in connection with FIG. 5) or employing two or more independently controllable light emitters (as discussed below in connection with FIG. 7, for example). In accordance with embodiments of the invention detailed below, selective variance of the first light component 120 can be used to control the width of the $W_{m1}$ of the depletion layer $D_1$ generating the AC-SPV signal and, hence, the width of the near-surface region of the specimen 50 being characterized with the semiconductor characterization system 100.

In one embodiment of the invention, the first light component 120 may be used to reduce the average surface potential and, hence, the width $W_{m1}$ of the resultant depletion region $D_1$. The second light component 130, in contrast, is intensity modulated and generates the alternating current in the AC-SPV. As noted previously, the relationship between AC-SPV and light intensity is essentially linear at very low light intensities, but is non-linear at higher intensities. This is caused by the dependence of the surface photovoltage signal on light intensity varying not only with changes in doping concentration, but also with changes in the height of the surface potential barrier, and the resultant width $W_{m1}$ of the depleted region $D_1$.

For strongly inverted surfaces, the effect of surface traps is negligible, so the height of the surface potential barrier for a given light intensity can be determined empirically using a series of standardized calibration wafers having known dopant concentrations, as described below. This empirically determined relationship will allow a fairly accurate and precise quantification of the average dopant concentration within the depletion layer $D_1$ and the width $W_{m1}$ of the depletion layer $D_1$ for a given light intensity. Furthermore, the depletion layer width $W_{m1}$ can be varied in a predictable manner by changing the light intensity, permitting incremental analysis of the near-surface region of a specimen 50, as discussed below. In addition, the higher light intensity will increase the strength of the AC-SPV signal, achieving a higher signal-to-noise ratio in the output signal of the amplifier 150. Alternatively, the light beam L may be focused on a smaller surface area of the specimen surface 52 for an AC-SPV having about the same signal-to-noise ratio as conventional low-intensity AC-SPV-based systems. This facilitates characterization of much more precisely targeted areas of a specimen 50.

Figure 5:
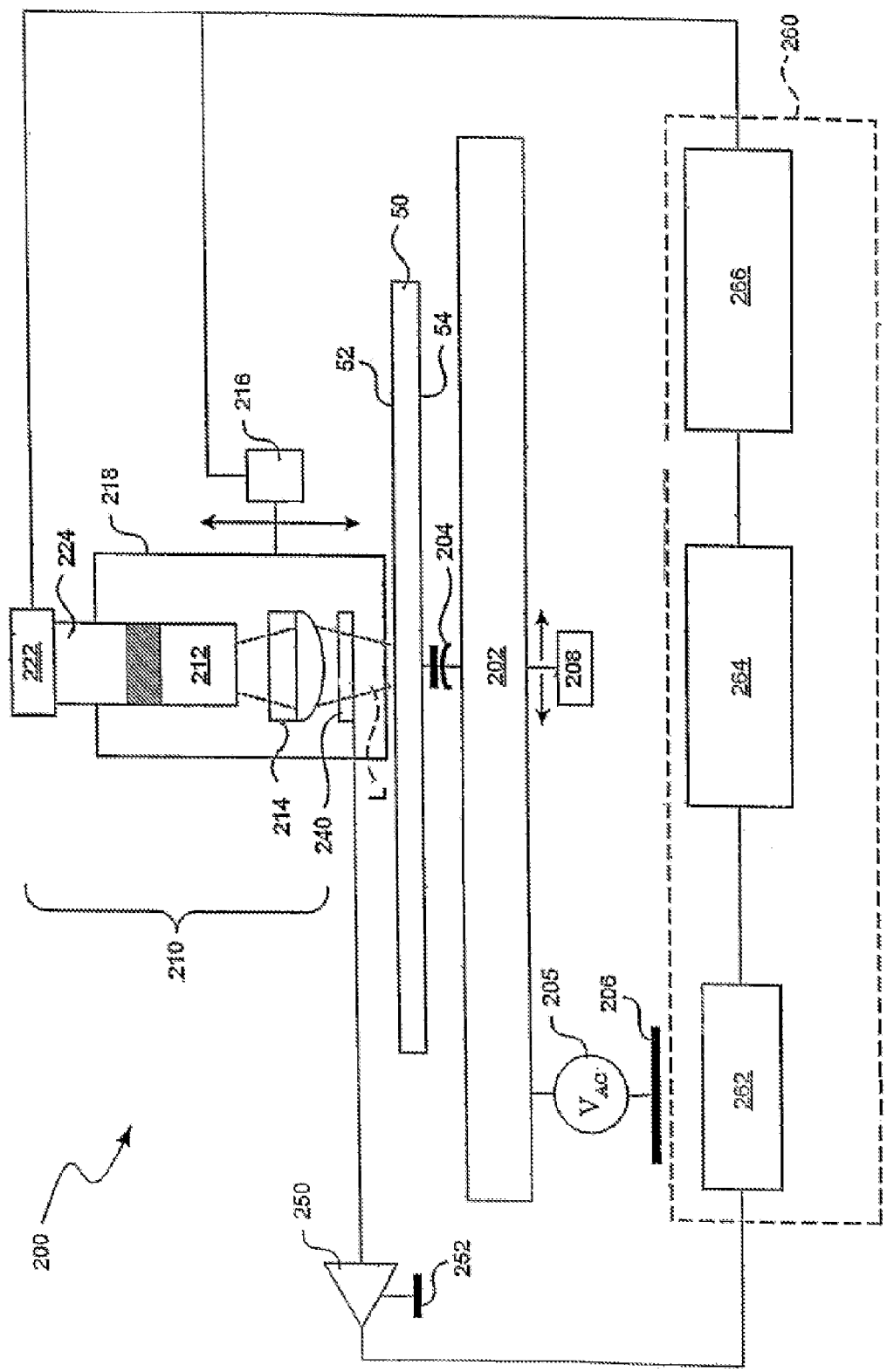
FIG. 5 schematically illustrates a semiconductor characterization system in accordance with a further embodiment of the invention employing a single light emitter.

FIG. 5 illustrates a semiconductor characterization system 200 in accordance with a more specific embodiment of the invention. Aspects of the system 200 are analogous to aspects of the more general block diagram of FIG. 4. Such analogous elements bear similar reference numerals in FIGS. 4 and 5, but the reference numerals in FIG. 5 are incremented by 100. Hence, the light system 210, electrode 240, amplifier 250, and controller 260 of FIG. 5 may be analogous to the light system 110, first electrode 140, amplifier 150, and controller 160, respectively, of FIG. 4.

FIG. 5 also illustrates a specimen holder 202 configured to support the semiconductor specimen 50 with respect to the light source 210. This holder 202 may be connected to ground 206 or another common reference voltage with the ground 252 of the amplifier 250 to measure the voltage across the specimen 50 to be measured. As shown schematically by a capacitor in FIG. 5, a dielectric support 204 (e.g., an array of pins defining an air gap or a dielectric plastic layer, e.g., polyurethane) may be disposed between the specimen 50 and the support 202.

The holder 202 may be driven by a motor 208 adapted to position the holder 202 and the specimen 50 it carries with respect to the light source 210. This enables a particular target area of a specimen surface 52 to be positioned for analysis using the light beam L. As suggested by the arrows in FIG. 5, the motor 208 may be adapted to move the holder 202 in an X-Y plane.

The light source 210 of FIG. 5 includes a light emitter 222 adapted to generate light of the desired wavelength and intensity. Light from the light emitter 222 may be directed toward the specimen 50 via a light guide, typified in FIG. 5 as a fiber optic cable 224. This fiber optic cable 224 can be coupled at one end to the emitter 222 and at the other end to a fiber optic collar 212 holding the front end in position relative to the electrode 240.

The light emitter 222 may take any of a variety of forms. In one embodiment, the light emitter 22 emits light, e.g., monochromatic light, at a wavelength that is shorter than a wavelength corresponding to an energy gap of the target area of the specimen surface 52 illuminated by the light beam L (e.g., area $52_L$ in FIG. 10, discussed below). For example, the light emitter 222 may comprise a UV diode laser generating light with a wavelength between about 365 nm and about 405 nm; such UV diode lasers are commercially available. In another implementation, the light emitter 222 may comprise CW diode-pumped solid state lasers having a wavelength of about 266 nm. Generally, shorter wavelengths are preferred over longer wavelengths.

The light source 210 may also include a lens 214, which may comprise one or more lenses. In one embodiment, the lens 214 is configured to collimate the light beam L so that the dimension of the target area on the specimen surface 52 illuminated by the light beam L will not vary with distance between the light source 210 and the specimen 50. In another embodiment, the lens 214 may be configured to focus the light beam L on a smaller spot on the substrate surface 52. The size of this spot will vary from one application to another, but a size of about 1-100 µm should work wall for most applications. One exemplary system useful for characterizing an area within the scribe line on a patterned semiconductor wafer, for example, focuses the beam on an area of about 20 µm. The lens 214 may comprise any known lens or system of lenses achieving the desired effect.

For example, the lens 214 may comprise one or more fused silica lenses or a gradient index lens.

An electrode 240 is disposed between the light source 210 and the specimen surface 50. The electrode 240 is at least generally transparent to the light beam L. In one particular embodiment, the electrode 240 comprises a generally circular disk of quartz or fused silica bearing an indium-tin-oxide (ITO) coating on the surface facing the specimen 50 and on the periphery of the disk. A metal ring (not specifically illustrated) may extend around the periphery in electrical contact with the ITO coating and be connected to a lead line that communicates with the amplifier 250.

The electrode 240 is moveable with respect to the specimen holder 202 by a Z-axis motor 216. The motor 216 moves a body 218 to which the electrode 240, optical cable collar 212, and lens 214 are rigidly attached to maintain a fixed relationship. The controller 260 may control operation of the motor 216 to maintain spacing between the electrode 240 and the specimen surface 52 in a desired range, e.g., 10-100 µm, by monitoring a capacitance signal from the electrode 240. The capacitance signal may be generated by coupling an ac voltage source 205 to the specimen 50 via the wafer holder 202. As the distance between the electrode 240 and the specimen surface 52 varies, so will the capacitance. To avoid interference between the capacitance signal and the AC-SPV, both of which may be measured with the same electrode 240, the ac voltage frequency may be different from the frequency of the second light component 130 of the light beam L, e.g., the ac voltage may have a frequency of about 70 kHz and the second light component 130 may have a frequency of about 30 kHz.

Figure 6A:
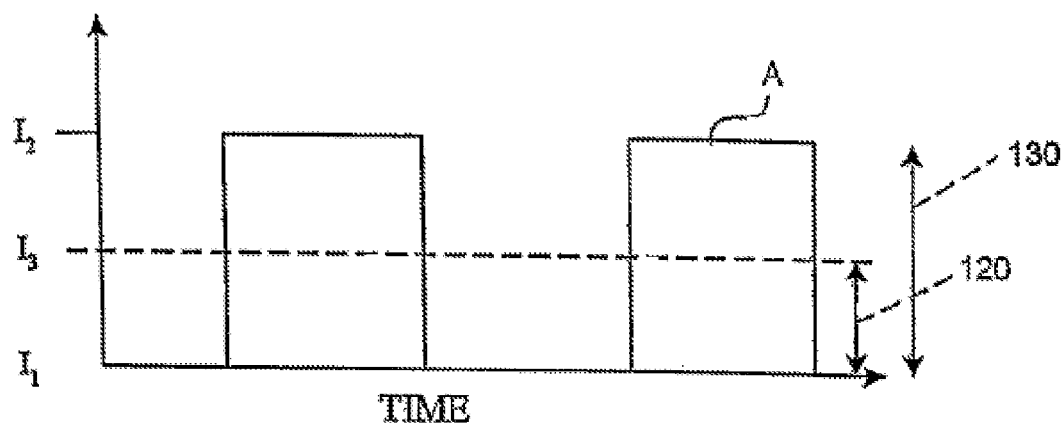
FIG. 6A graphically illustrates time dependence of a first light intensity generated by the semiconductor characterization system of FIG. 5.
Figure 6B:
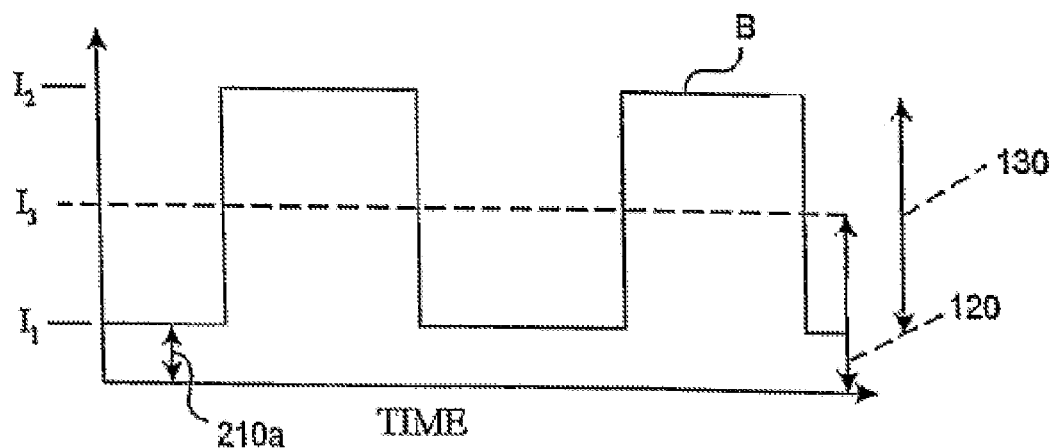
FIG. 6B graphically illustrates time dependence of a second light intensity generated by the semiconductor characterization system of FIG. 5.

As noted above in the discussion of FIG. 4, adjusting the first light component 120 can effectively alter the width $W_{m1}$ of the depletion layer $D_1$; the second light component 130 is intensity modulated and generates the alternating component of the AC-SPV. The graphs in FIGS. 6A-B schematically illustrate one manner in which the first and second light components 120 and 130 may be varied by the light emitter 222 of FIG. 5. The waveform A in FIG. 6A is a square wave form, with the intensity shifting between a first intensity $I_1$ (arbitrarily set at the abscissa) to a second, higher intensity $I_2$. The amplitude of this waveform, i.e., the difference between these two intensities $I_1$ and $I_2$, defines the intensity of the second light component 130. The average intensity $I_3$ of the illumination may be considered the first light component 120 in that this average intensity is largely what defines the difference between the average width $W_{m1}$ of the depleted layer $D_1$ and the width $W_{m0}$ of the equilibrium depletion layer $D_0$.

The wave form B in FIG. 6B is similar to wave form A in that it is a square wave form and, in one embodiment, has the same amplitude between its maximum and minimum intensities $I_1$ and $I_2$ (and hence has a second light component 130 of the same intensity) as wave form A. However, the actual intensity of the maximum and minimum intensities $I_1$ and $I_2$ are higher in wave form B than in wave form A, so the average intensity $I_3$, and hence the intensity of the first light component 120, is greater in FIG. 6B than in FIG. 6A. Hence, by selectively altering the modulation of light intensity generated by the light emitter 222, the first light component 120 of the light beam L may be varied from one measurement to the next without necessitating any change in the second light component 130 of the same light beam.

The controller 260 of the semiconductor characterization system 200 of FIG. 4 may take the form of one or more computers including one or more programmable processors 266. The processor 266 is adapted to carry out methods in accordance with further embodiments of the invention (e.g., the methods discussed under heading C below). For example, the controller 160 may be used to control the intensity of the light beam L, including the amplitude of the modulation, to selectively control the intensity of the first and second light components 120 and 130.

The controller 260 may also be adapted to process signals from the amplifier 250 to determine characteristics of a near-surface region of the specimen 50. As suggested in block form in FIG. 5, the controller 260 generally includes an analog-to-digital converter 262, a digital signal processor 264, and the computer processor(s) 266 noted above. The signal from the amplifier 250 may be delivered to the analog-to-digital converter 262, which outputs a digital signal to the digital signal processor 264. The controller 260 may also include a filter (not shown) to filter out noise in the input to the analog-to-digital converter 262. The digital signal processor 264 may be configured to extract the first harmonic of the signal and separate the first harmonic into two orthogonal components in a function analogous to that performed by an analog lock-in amplifier. Such digital signal processors are well known in the art and need not be detailed here. The signal from the digital signal processor 264 may be perceived by the computer 266 and processed, e.g., in accordance with one of the methods outlined below.

Figure 7:
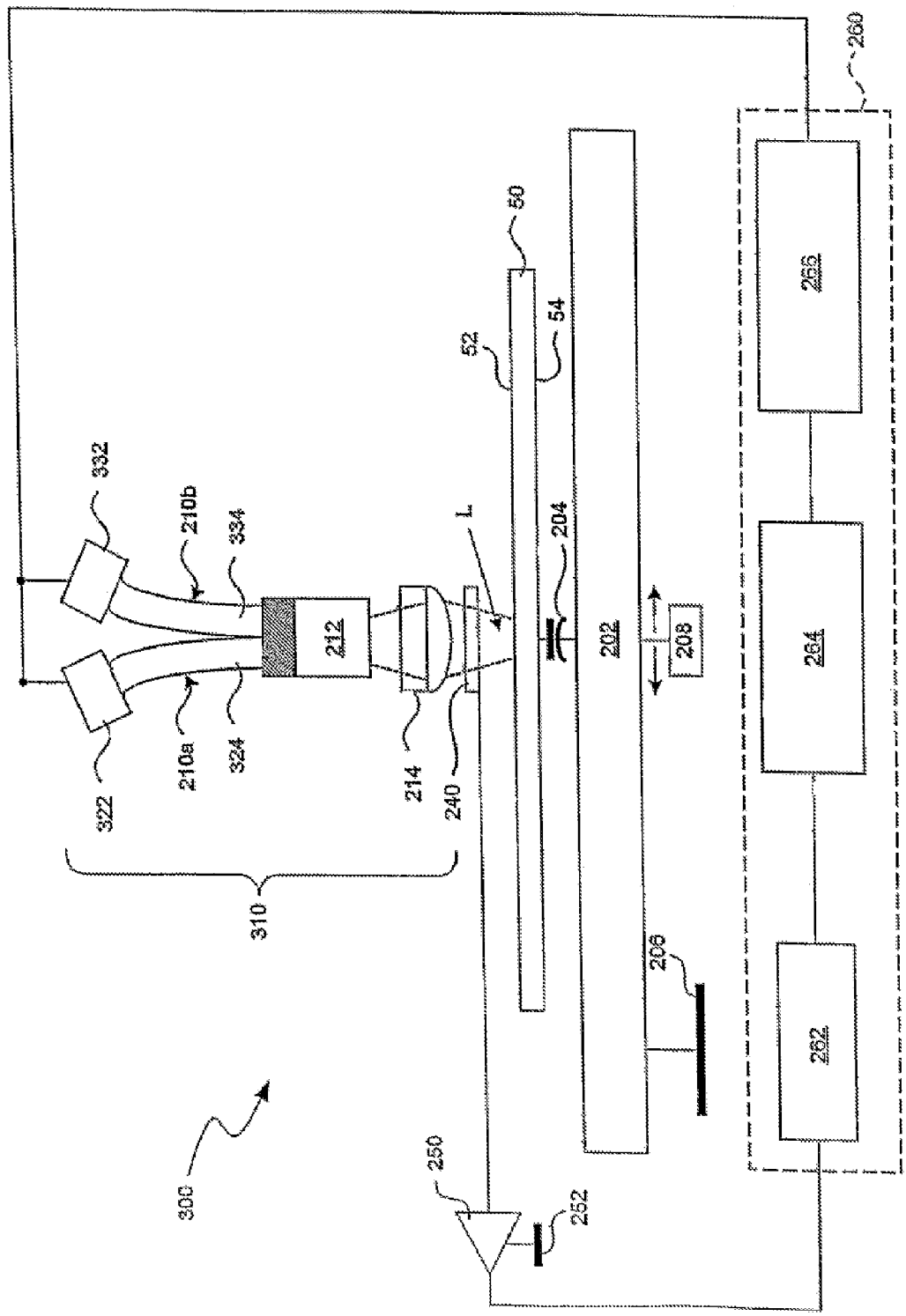
FIG. 7 is a more detailed schematic illustration of a semiconductor characterization system that employs two light emitters in accordance with an alternative embodiment of the invention.

FIG. 7 schematically illustrates a semiconductor characterization system 300 in accordance with an alternative embodiment of the invention. Some elements of this system 300 may be substantially the same as elements of the semiconductor characterization system 200 of FIG. 5 and such elements bear like reference numerals in FIGS. 5 and 7.

One difference between the semiconductor characterization systems 200 and 300 is the nature of the light beam L. The light source 210 of FIG. 5 has a single light emitter 222 that generates both the first light component 120 and the second light component 130. In contrast, the light source 310 of FIG. 7 includes a first light element 210a and a second light element 210b. The first light element 210a comprises a first light emitter 322 and a light guide 324, e.g., a bundle of fused quartz optical fibers, configured to guide light along a first path toward the specimen surface 52. Similarly, the second light element 210b comprises a second light emitter 332 and a light guide 334, which may be substantially the same as the light guide 324, is configured to guide light along a second path toward the specimen surface 52. Both of the light guides 324 and 334 may be coupled to the fiber optic collar 212. In an embodiment, the first and second light elements 210a and 210b are mixed together within the collar 212, e.g., by randomly comingling the optical fiber strands of the light guides 324 and 334. In an alternative embodiment (not shown), light from each of the light elements 210a and 210b may be guided independently toward the same target area of the specimen surface 52, e.g., by being oriented at an angle with respect to one another. This angle is desirably relatively small, though, so both light elements 210a and 210b impinge on the surface 52 at an angle as close to perpendicular as reasonably practicable. In another alternative approach, the light from the first and second light emitters 222 and 232 may be mixed, e.g., using polarization optics, before entering a common light guide, which may be similar to light guide 224 in FIG. 5.

The first and second light elements 210a and 210b both deliver light, e.g., monochromatic light, having a wavelength that is shorter than a wavelength corresponding to an energy gap of the target area of the specimen surface 52 illuminated by the light L. Generally, shorter wavelengths are preferred over longer wavelengths. Wavelengths of the first and second light emitters 322 and 332 may be substantially the same, e.g., both may be lasers or diodes generating light at the same wavelength. In another embodiment, the wavelengths of the first and second light emitters 322 and 332 are different from one another. If the wavelength of the first light emitter 322 is longer than the wavelength of the second light emitter 332, the first light emitter 322 may be less expensive and/or more powerful than the shorter-wavelength second light emitter 332, reducing cost and/or improving performance of the semiconductor characterization system 300. Devices noted above as being suitable for the light emitter 222 of FIG. 5, e.g., UV diode lasers or CW diode-pumped solid state lasers, may also be useful as the light emitters 322 and 332 of FIG. 7.

Although the first and second light emitters 322 and 332 may be varied together, in one exemplary embodiment the first and second light emitters 322 and 332 are independently controllable. These light emitters 322 and 332 may be operatively coupled to the controller 260, which may be configured to independently vary the light intensity generated by each of the light emitters 322 and 332, e.g., by selectively varying the intensity of the first light emitter 322 from one measurement to another and modulating the intensity of the second light emitter 332, e.g., in a chopped, square wave form adapted to generate an AC-SPV.

In the embodiment of FIG. 5, the single light emitter 222 was controlled to generate first and second light components 120 and 130 of varying intensities. In one particular embodiment, the first light element 210a of FIG. 7 is configured to provide a non-modulated light that does not contribute to the second component 120 of the light beam L. The second light element 210b may provide an intensity-modulated light similar to that of the light emitter 222 of FIG. 5. Hence, as explained above in connection with FIG. 6A, this second light element 210b will contribute to both the first light component 120 and the second light component 130. If so desired, though, the intensity of the first light component 120 may be adjusted without altering the second light element 210. In the context of FIG. 6, for example, the first light element 210a may have a first intensity (e.g., the first light emitter 322 may be off) when generating waveform A and a second, higher, intensity when generating waveform B. The increase in intensity of the first light element 210a is reflected in FIG. 6B by the increase 210a in the first light intensity $I_1$. Hence, the second light component 130 may be generated entirely by the second light element 210b, but both the first light element 210a and the second light element 210b contribute to the first light component 120.

The area illuminated by the first and second light elements 210a and 210b may be substantially coextensive. In one useful embodiment, the two elements 210a and 210b may illuminate areas of different dimension. The area illuminated by the first light element 210a is desirably at least as great as the area illuminated by the second light element 210b. In one particular embodiment, the first light element 210a illuminates a surface area that is larger than and encompasses a surface area illuminated by the second light component element 210b. For example, the first light element 210a may illuminate substantially the entire forward surface 52 of the specimen 50, with the second light element 210b illuminating a more focused region under test. Illuminating a larger area with the first light element 210a than with the second light element 210b can be particularly useful when attempting to determine the characteristics of a localized target area, e.g., measuring within a scribe line between adjacent integrated circuit dies on a patterned semiconductor wafer.

FIGS. 8-13 illustrate aspects of a further embodiment of the invention. FIG. 8 schematically illustrates just selected components of a semiconductor characterization system 400. In particular, FIG. 8 illustrates only the light source 410 and the specimen 50. The balance of the semiconductor characterization system 400 may directly parallel the other elements in FIG. 5 (e.g., specimen holder 202, controller 260, etc.)

The light source 410 of FIG. 8, which is shown in cross-section in FIG. 9, includes three light components. The first light element 210a and the second light element 210b may be substantially identical to those of FIG. 7 and like reference numbers are used in both figures to indicate like elements. The third light element 210c of light source 410 includes a third light emitter 442 and a guide 444, typified as an optical fiber cable. The first, second, and third light guides 324, 334, and 444, may be joined together in a common fiber optic collar 412. As best seen in FIG. 9, the optical fiber strands of the first and second guides 324 and 334 may be comingled in a central area 320, e.g., a central circular area, as shown, within the collar 412. The third guide 444 encircles the central region 320. Preferably, the fiber optic strands from the first and second guides 324 and 334 are not comingled with the fiber optic strands of the third guide 444. This will result in a light beam L, which may be substantially similar to the light beam L in FIG. 7, generally centered within an annular "guard" beam B. If so desired, a lens 414 may be disposed between the fiber optic collar 412 and the specimen 50. In embodiments of the invention, the lens 414 may be configured to focus the light beam L and the guard beam B toward a smaller target area of the specimen surface 52. Suitable lenses 414 may be similar to those noted above as suitable for use as lenses 214, e.g., one or more fused silica lenses or a gradient index lens.

Figure 10:
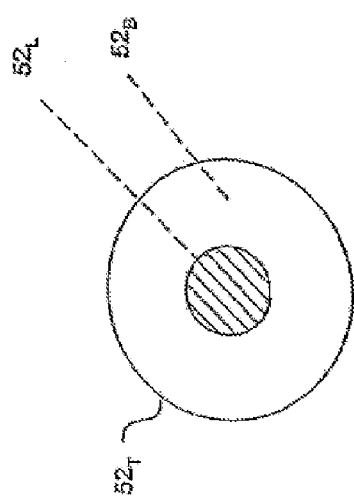
FIG. 10 schematically illustrates idealized illumination of a target area of the semiconductor specimen using the characterization system of FIGS. 8 and 9.
Figure 11:
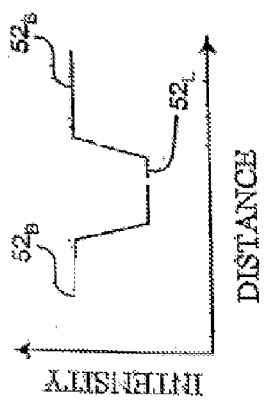
FIG. 11 schematically illustrates the intensity of the illumination shown in FIG. 10.

FIGS. 10 and 11 schematically illustrate an illuminated target area $52_T$ of the specimen surface 52 (FIG. 4). A characterized area $52_L$, which is illuminated by the light beam L, is generally centered within and encircled by a guard illumination area $52_B$, which is illuminated by the guard beam B. The relative dimensions of the characterized area $52_L$ and the guard illumination area $52_B$ can be varied within a wide range. As noted above in connection with FIG. 5, the area illuminated by the light beam L (i.e., characterized area $52_L$ in FIG. 10) may be about 1-100 μm, e.g., about 20 μm in diameter. The outer diameter of the guard illumination area $52_B$ is desirably at least about 40 μm larger than the characterized area $52_L$, i.e., it may extend about 20 μm or more radially outwardly from the periphery of the characterized area $52_L$. In selected embodiments of the invention, the guard illumination area $52_B$ may extend radially outwardly from the periphery of the characterization area $52_L$ about 20-1000 μm.

As shown in FIG. 11, the intensity of the guard beam B (FIG. 8) is desirably substantially higher than the intensity of the light beam L (FIG. 8) illuminating the characterized area $52_L$. As discussed above, the intensity modulation of the second light component 230 will modulate the intensity of the light beam L. In one embodiment of the invention, though, the guard beam B may be substantially continuous, i.e., not intensity modulated. In practice, it is not critical to keep the intensity within the guard area $52_B$ uniform far from the central characterized area $52_L$. Maintaining a high, uniform light intensity in the immediate vicinity of the characterized area $52_L$ is anticipated to be beneficial, though.

Figure 12:
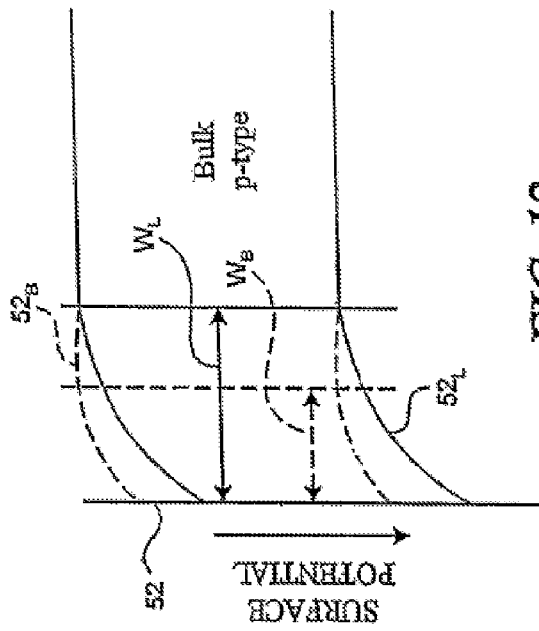
FIG. 12 is a schematic band diagram illustrating aspects of the behavior of an idealized semiconductor specimen in response to the illumination shown of FIGS. 10 and 11.
Figure 13:
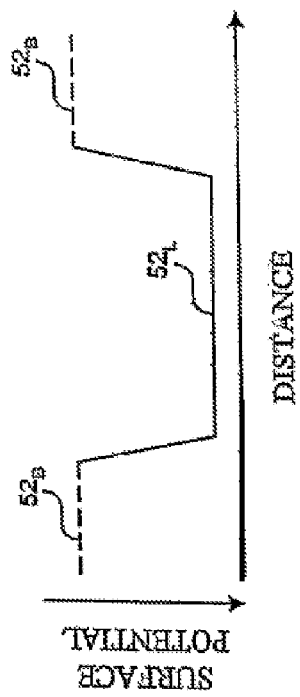
FIG. 13 schematically illustrates surface potential of the idealized semiconductor specimen of FIG. 12 in response to the illumination shown of FIGS. 10 and 11.

FIGS. 12 and 13 schematically illustrate the relative surface potentials of the characterized area $52_L$ and the guard illumination area $52_B$. FIG. 12 plots the height of the surface potential barrier as a function of distance inwardly from the surface 52 of the semiconductor specimen 50 (FIG. 4). The upper solid curve indicates the limit of the conduction band for the characterized area $52_L$, whereas the upper dashed curve represents the limit of the conduction band in the guard illumination area $52_B$. Similarly, the lower solid curve indicates the limit of the valance band in the characterized area $52_L$ and the lower dashed curve indicates the limit of the valance band in the guard illumination area $52_B$. It is also worth noting that the depletion layer width $W_L$ associated with the characterizing area $52_L$ is wider than the depletion layer width $W_B$ associated with the guard illumination area $52_B$. This difference reflects the different intensities of the light beam L and the guard beam B (FIG. 9). FIG. 13 schematically illustrates height of the surface potential barrier across a width of the surface target area $52_T$. As in FIG. 12, the solid portion of the curve is associated primarily with the characterizing illumination area $52_L$ and the dashed part of the curve is associated with the guard illumination area $52_B$. Both curves reflect the higher surface potential barrier in the characterized area $52_L$ with respect to the guard illumination area $52_B$. The lower surface potential barrier encircling the characterized area $52_L$ can effectively confine the electrons (in a p-type semiconductor) within the characterized area $52_L$, reducing any spread of the area being characterized that may otherwise occur if the light beam L is used alone.

Methods for Characterizing Semiconductors

Other embodiments of the invention provide methods for characterizing an aspect of a semiconductor specimen. For ease of understanding, the methods outlined below are discussed with reference to the semiconductor characterization systems 100, 200, 300, or 400 of FIGS. 4-13. The methods are not to be limited to any particular system illustrated in the drawings or detailed above, though; any apparatus that enables performance of a method of the invention may be used instead.

One embodiment of the invention allows determination of the dopant concentration in a near-surface region of the semiconductor specimen 50. In this embodiment, a semiconductor specimen 50 of interest may be prepared for analysis, if necessary, by forming a thin oxide film on the specimen surface 50 and thermally reactivating the dopant or dopants (e.g., boron) by thermal treatment. Both of these processes are conventional. Some specimens 50 may already have a surface charge sufficient to induce an inversion layer, but it may be necessary to increase the sufficient surface charge of other specimens. In one embodiment, this is done before the specimen 50 is placed in the sample holder 202 (FIG. 5), e.g., by depositing a corona charge. Alternatively or in addition to the corona charge, the specimen 50 may be charged by the semiconductor characterization system 100 during measurement.

When suitably prepared, the specimen 50 may be placed in the specimen holder 202 and positioned with respect to the light source 110 and the first electrode 140 to achieve the desired spacing between the specimen surface 52 and the electrode 140 and to position a target area of the specimen surface 52 for illumination by the light source 110. The light source 110 may be activated during positioning of the specimen 50 or just before a measurement is to be taken. The activated light source 110 will illuminate the target area with a light beam L that includes a first light component 120 and a second light component 130. The AC-SPV generated by the light beam L will induce a signal in the electrode 140, which is communicated to the controller 160 via the amplifier 150. The controller 160 may record this signal as a first ac voltage signal. If so desired, this signal may be used (in a manner discussed below) to determine a first doping concentration of a first near-surface region of the specimen 50.

As noted before, the width $W_{m1}$ of the depletion layer $D_1$ characterized by a light beam L will vary with the intensity of the light beam L. In embodiments of the invention, the intensity of the light beam L can be selected to measure a target depth that is correlated to a depth of interest. For example, the specimen 50 may be a semiconductor wafer that has been doped, e.g., by ion implantation, during one stage of production. This doped region will have an anticipated thickness, which may be empirically determined from prior production runs, and the target thickness may be correlated to this anticipated thickness. This correlation may vary depending on the nature of the specimen. For some specimens, the target thickness may be equal to the anticipated thickness. For others, e.g., where a heavily doped region underlies a thin film, it may be beneficial to make the target thickness thinner, e.g., 10% or 20% thinner, when measuring the thin film. In other circumstances, it may be beneficial to use a target thickness that exceeds the thickness of the layer of interest.

An aspect of the intensity of the light beam L may be changed to generate a modified light beam L' (not shown). In one embodiment, this comprises changing the intensity of the first light component 120. If so desired, the intensity of the second light component 130 may also be varied, but the intensity of the second light component 130 in one useful embodiment remains substantially constant from one measurement to the next, at least for a particular target area of a particular specimen 50. The modified light beam L' illuminates the target area of the specimen surface 52, generating a second AC-SPV, which ultimately may be recorded as a second ac voltage signal by the controller. This second signal may be used to determine a second doping concentration in a second near-surface region of the specimen.

As explained above, the difference in intensity of the first light beam L and the modified light beam L' will change the height of the surface potential barrier of the target area which, in turn, changes the width $W_{m1}$ of the depletion layer $D_1$. A first AC-SPV generated by the first light beam L is, therefore, characteristic of a near-surface region of the specimen 50 having a first width $W_{m1}$ and the AC-SPV generated by the modified light beam L' is characteristic of a near-surface region of the specimen 50 having a different second width $W_{m2}$. Hence, one of the two widths will include an incremental width that is not included in the other. For example, if the intensity of the first light beam L is less than the intensity of the modified beam L', the first width $W_{m1}$ will be wider than the second width $W_{m2}$, so the first width $W_{m1}$ will include an incremental width $W_A$ of the specimen 50 that is not included in the second width $W_{m2}$, i.e., $W_{m1} - W_{m2} = W_A$.

The difference in the first AC-SPV and the second AC-SPV may, therefore, be attributed to the incremental width $W_A$. In one embodiment, the first doping concentration and the second doping concentration may be separately calculated, as noted above. The difference between the two doping concentrations may be attributed to the region encompassed in one AC-SPV measurement and not the other, i.e., $W_A$, in the preceding example. By selectively adjusting the light intensity to generate a second modified light beam L'', a third doping concentration can be determined for a depletion layer having a third width $W_3$.

Figure 14:
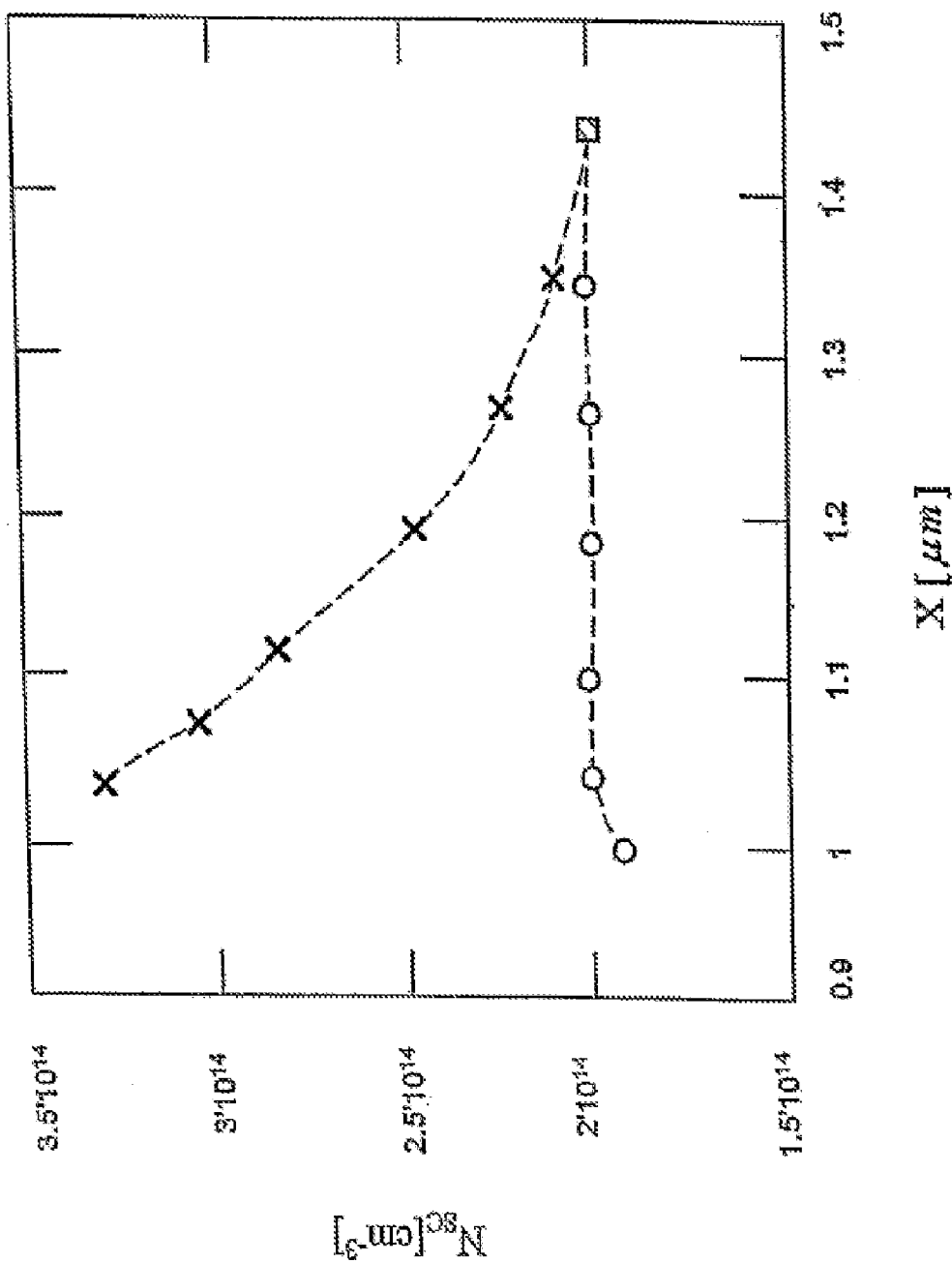
FIG. 14 graphically depicts a dopant concentration profile generated in accordance with an embodiment of the invention.

The same process outlined above may then be used to characterize the dopant concentration of a second incremental width between the third width $W_3$ and the first or second width $W_1$ or $W_2$. Continuing this process for a series of successive widths $W_1$, $W_2$, $W_3$, etc. generates a series of dopant concentrations for a series of different incremental widths that may be used to generate a dopant concentration profile. FIG. 14 illustrates one such profile, with dopant concentration ($N_{sc}$) shown on the ordinate and the location (X in formula G below) associated with each incremental width on the abscissa.

System Calibration and Determination of Dopant Concentration

The following discussion sets forth one useful way to correlate measured AC-SPV signals with a dopant concentration in embodiments of the invention. Other embodiments may use any other suitable approach instead. Like the preceding discussion of select methods of the invention, the following discussion refers to specific systems outlined above, but other suitable apparatus may be used instead. The calculations outlined below may be performed by a processor of the controller 160, e.g., using an ASIC or executable software.

System Calibration

The signal phase of the second light component 120 of the light beam L is adjusted using the programmed controller 160 at low light intensity, i.e., at an intensity wherein the SPV signal is directly proportional to light intensity, using a thermally oxidized semiconductor specimen with low surface state density, i.e., low surface recombination. The controller may adjust this phase until the ratio of the real component (Re) to the imaginary component (Im) reaches a value of $-2/\Pi$. The rotation angle required to achieve this ratio is stored for use with measured specimens.

The intensity of the light beam L may be measured using a calibrated photo-detector. The light intensity may be changed, e.g., by changing power delivered to the light source 110 or by using neutral intensity filters (not shown), until the measured intensity falls within a predetermined acceptable range. This calibration process sets the light intensity, and thus the generation rate (G) of electron-hole pairs in the near-surface region, which is tied to the light intensity, at a known value.

Determining Gain of Amplified AC-SPV Signal

The gain of the signal amplification channel (including coupling capacitances) may be determined by comparing a measured imaginary component of the amplified AC-SPV signal, $ImV_{Fm}$, to a calculated imaginary component, $ImV_F$, of the signal. A surface charge may be developed on a uniformly doped specimen, e.g., an n-type silicon specimen, of known doping concentration (e.g., $10^{16}$ cm$^{-3}$) that is coated with native oxide. The surface charge may be developed using a corona wire, for example. The charging may continue until the signal from the amplifier 150 reaches saturation, indicating that the specimen surface 52 has reached inversion conditions.

Figure 15:
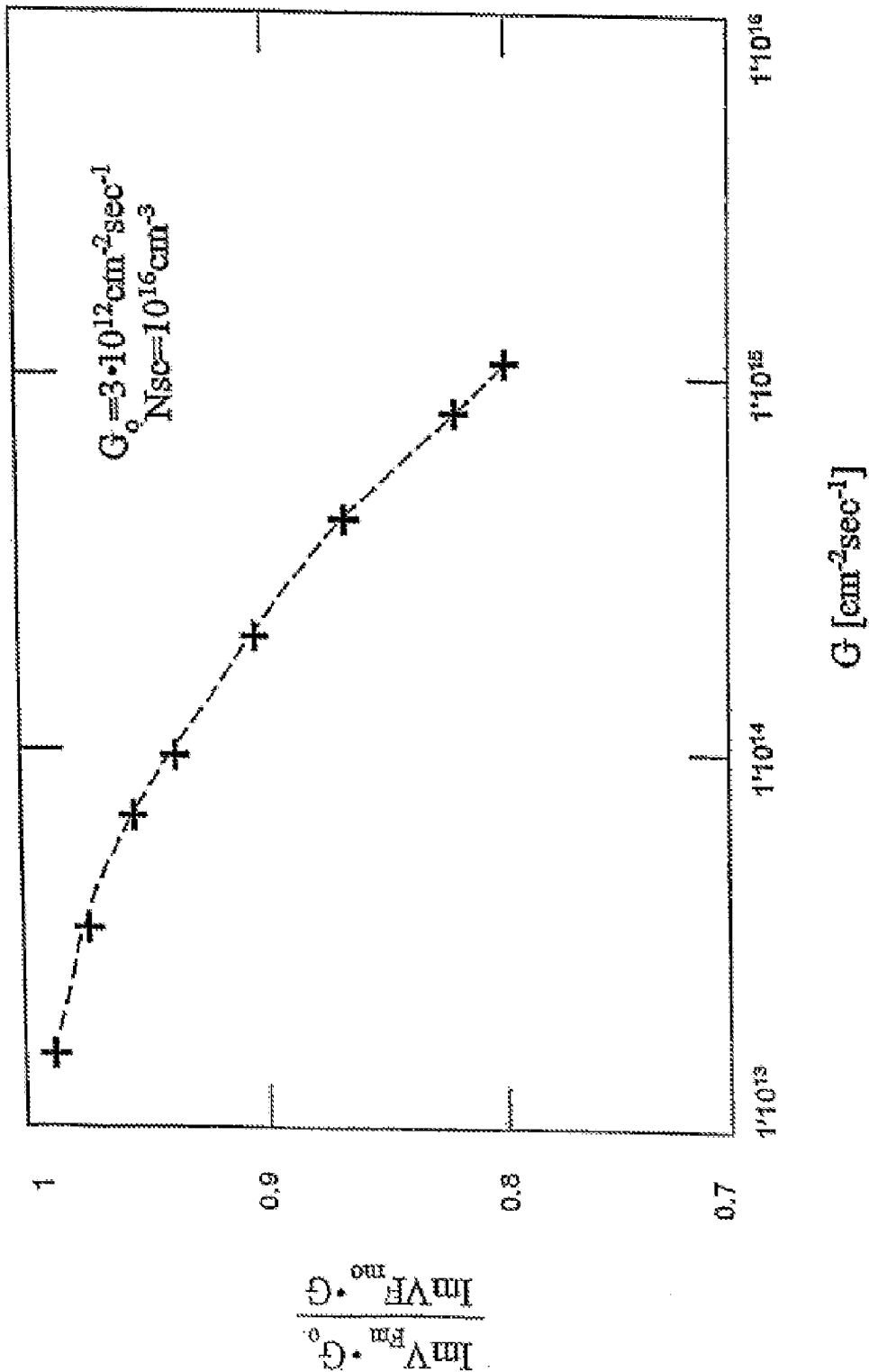
FIG. 15 graphically depicts the relationship between optical generation rate and the imaginary component of a normalized AC-SPV signal for n-type silicone with a doping concentration of about $10^{16}$ cm$^{-3}$.

The calibrated light source 110 may be activated to illuminate a portion of the specimen surface 52 with the light beam L, which has a known intensity and electron-hole generation rate G. The dependence of imaginary component of the signal, $ImV_{Fm}$, on the electron-hole generation rate G is measured. The normalized $ImV_{Fm}/G$ signal saturates at low intensities, i.e., when $ImV_{Fm}$ depends linearly on the light intensity. FIG. 15 plots the ratio of the normalized signal divided by its low intensity normalized value, given by Formula A $$\frac{ImV_{Fm}}{ImV_{Fo}} \frac{G_o}{G},$$

where $G_o$ denotes the generation rate at which the normalized signal reaches its saturation value $ImV_{Fmo}$.

The calculated imaginary component $ImV_F$ of the signal may be calculated based on recombination properties of the surface region. The calculation assumes the semiconductor surface is illuminated with a short wavelength radiation that penetrates to a depth substantially shorter than the width of the depletion layer. This illumination is also assumed to be 100% square-wave intensity modulated. The imaginary, $ImV_F$, and real, $ReV_F$, components of the signal are given respectively by $ImV_F = ImV_{Fi} + ImV_{Fd}$ (Formula B) and $ReV_F = ReV_{Fi} + ReV_{Fd}$ (Formula C), where $$ImV_{Fi} = -\frac{kT}{2\pi q}\int_{-\pi}^{0}\ln\left[1 - a_i\exp\left(-\frac{\theta}{\omega\tau_i}\right)\right]\sin\theta d\theta - \frac{kT}{\pi q}\ln\left[\frac{G}{v_t N_{sc}} + \exp\left(-\frac{qV_{mo}}{kT}\right)\right],$$

$$ImV_{Fd} = -\frac{kT}{2\pi q}\int_{0}^{\pi}\ln\left[1 - a_d\exp\left(-\frac{\theta}{\omega\tau_d}\right)\right]\sin\theta d\theta - \frac{1}{\pi}v_{so},$$

$$ReV_{Fi} = \frac{kT}{2\pi q}\int_{-\pi}^{0}\ln\left[1 - a_i\exp\left(-\frac{\theta}{\omega\tau_i}\right)\right]\cos\theta d\theta, \text{ and}$$

$$ReV_{Fd} = \frac{kT}{2\pi q}\int_{0}^{\pi}\ln\left[1 - a_d\exp\left(-\frac{\theta}{\omega\tau_d}\right)\right]\cos\theta d\theta.$$

Coefficients $a_i$ and $a_d$ are determined as follows:

$$a_i = \frac{\exp\left(-\frac{\pi}{\omega\tau_d}\right)\left[1 - \exp\left(-\frac{\pi}{\omega\tau_i}\right)\right] + \left[1 + \frac{G}{v_t N_{sc}}\exp\left(\frac{qV_{mo}}{kT}\right)\right]\left[1 - \exp\left(-\frac{\pi}{\omega\tau_d}\right)\right]}{\exp\left(-\frac{\pi}{\omega\tau_d} - \frac{\pi}{\omega\tau_i}\right) - 1},$$

$$a_d = \frac{\exp\left(-\frac{qV_{mo}}{kT}\right)\left[1 - \exp\left(-\frac{\pi}{\omega\tau_i}\right)\right] - \left[\frac{G}{v_t N_{sc}} + \exp\left(-\frac{qV_{mo}}{kT}\right)\right]\left[1 - \exp\left(-\frac{\pi}{\omega\tau_d}\right)\right]}{\left[\frac{G}{v_t N_{sc}} + \exp\left(-\frac{qV_{mo}}{kT}\right)\right]\left[\exp\left(-\frac{\pi}{\omega\tau_d}\right) - \exp\left(-\frac{\pi}{\omega\tau_i}\right)\right]}$$

In turn, $\tau_i$ and $\tau_d$ are determined by the following formulas:

$$\tau_i = \left\{\frac{q}{kT}[v_t N_{sc}\exp(-qV_{mo}/kT) + G]\sqrt{2qV_m/\varepsilon_s N_{sc}}\right\}^{-1},$$

$$\tau_d = \left[\frac{q}{kT}v_t N_{sc}\exp(-qV_{mo}/kT)\sqrt{2qV_m/\varepsilon_s N_{sc}}\right]^{-1}$$

where q is a magnitude of an elementary charge, kT is a thermal energy at room temperature, $N_{sc}$ is net density of the dopants in the space charge region (depletion layer), $\varepsilon_s$ is permittivity in semiconductor, and $v_t$ is a surface recombination velocity. Magnitudes of the imaginary and real component only weakly depend on $v_t$ under inversion conditions under illumination, so in the most cases $v_t = 10^3$ cm/sec can be used. $V_{mo}$ is the height of surface potential barrier at the onset of strong inversion in thermal equilibrium and is given by:

$$V_{mo} = 2\frac{kT}{q}\ln\left(\frac{N_{sc}}{n_i}\right),$$

where $n_i$ is an intrinsic carrier concentration. $V_m$ is the height of the surface potential barrier under illumination.

Figure 16:
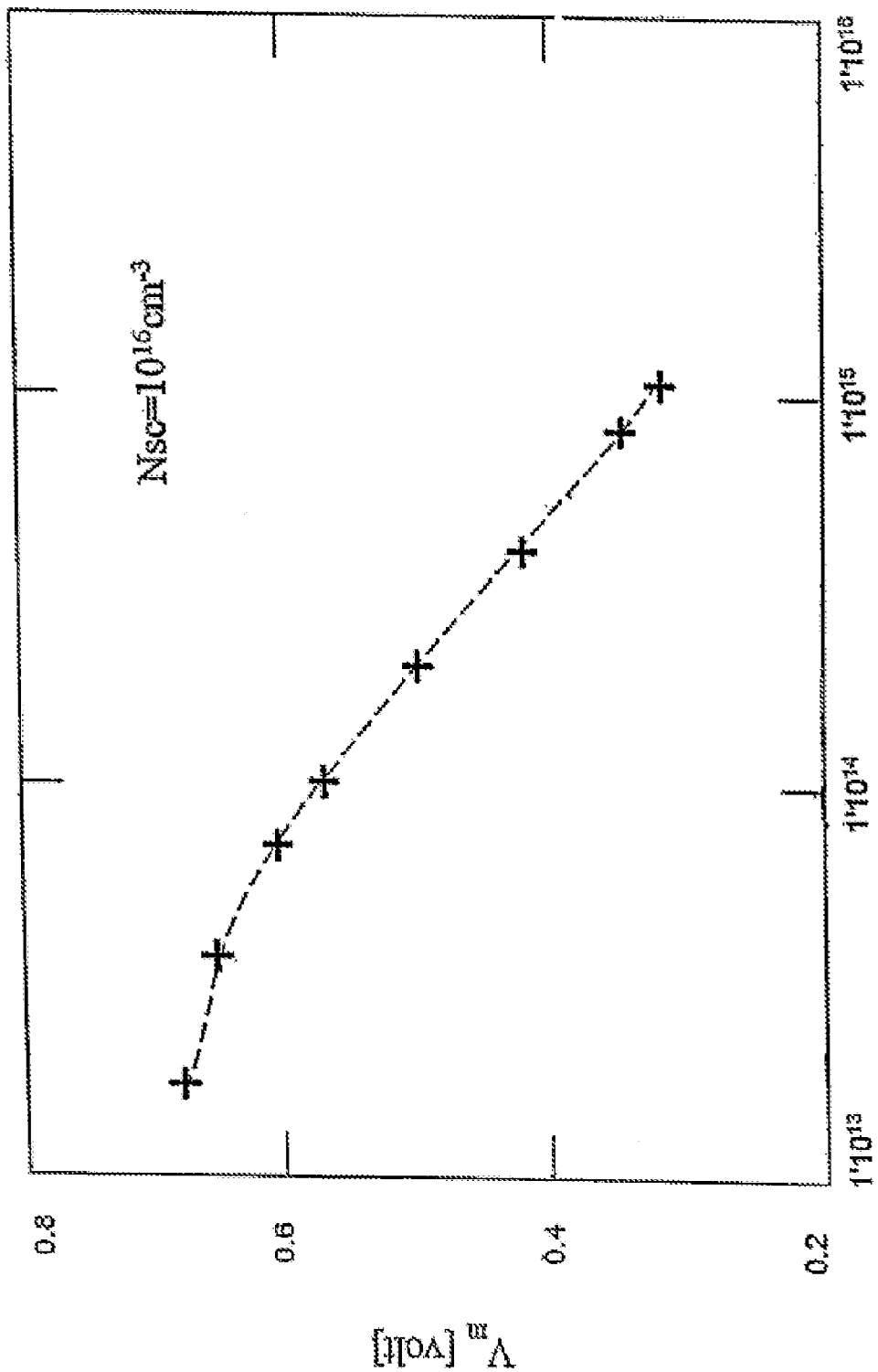
FIG. 16 graphically depicts the dependence of surface potential barrier height on the optical generation rate of excess carriers.

The gain of the system is determined in two steps. First, the dependence of $V_m$ on the generation rate for the calibration specimen is determined by comparing the normalized measured imaginary component $ImV_F$ and normalized calculated imaginary component $ImV_{Fo}$, each divided by their low intensity saturation values. The normalized measured imaginary component is given by Formula A, above. The normalized calculated imaginary component is given by Formula D:

$$\frac{ImV_F(G, V_m)}{ImV_{Fo}(G_o, V_{mo})}\frac{G_o}{G}$$

where $ImV_F$ is given by Formula B, above, with doping concentration of the measured specimen ($10^{16}$ cm$^{-3}$ for the specimen plotted in FIG. 15), and $ImV_{Fo}$ is given by Formula B with the same doping concentration and the height of the surface potential barrier given by its equilibrium value $V_{mo}$. Varying $V_m$ for the calibration specimen will indicate the correlation between the measured and calculated ratios. This, in turn, permits determination of the dependence of $V_m$ on the generation rate. The result for the specimen of FIG. 15 is shown in FIG. 16. Knowing the intensity dependence of $V_m$, the gain of the signal amplification channel is determined by dividing the measured imaginary component by the calculated imaginary component, i.e., $$\text{Gain} = ImV_{Fm}(G)/IMV_F(G, V_m)$$

Determination of Doping Concentration

Approach 1: In one embodiment, both real and imaginary components of the signal are measured and compared with Formulas B and C, both above. Imaginary and real components depend on three parameters—carrier generation rate, G, doping concentration, $N_{sc}$, and the height of the surface potential barrier, $V_m$. G for a given light intensity is known from the calibration of the light source 110, so comparison of the imaginary and real components permits the two remaining parameters, $N_{sc}$ and $V_m$, to be determined. In turn, knowledge of these parameters allows the width $W_{mn}$ of a particular depletion layer $D_n$ using Formula E:

$$W_{mn} = \sqrt{\frac{2\varepsilon_s V_M}{qN_{sc}}}.$$

By determining $N_{sc}$ and $W_m$ at different generation rates, G' and G", (and, hence different depletion layer widths $W_{mn}$ and $W_{mn}+1$) the local doping concentration can be calculated using Formula F:

$$N_{sc}(X) = \frac{N'_{sc}W_{mn} - N''_{sc}W_{mn+1}}{W_{mn} - W_{mn+1}}$$

where the doping concentration $N_{sc}(X)$ corresponds to the dopant concentration at a depth X calculated using Formula G: $X = \frac{1}{2}(W_{mn} + W_{mn+1})$.

This Approach 1 requires precise control of the system phase shift and the measurement area boundary conditions. A light source such as the light source 410 of FIG. 8 may enhance control of the boundary conditions of the area being measured (52$_L$ in FIG. 10). Even so, Approach 1 could introduce unacceptable error into the resulting values of the dopant concentrations $N_{sc}$.

Approach 2: An alternative embodiment empirically determines, during system calibration, the dependence of $V_m$ on G and $N_{sc}$ for a specific set of measurement conditions. Subsequently, the dopant concentration $N_{sc}$ of an unknown specimen may be determined by comparing measured and calculated values of imaginary components at selected G values. Since imaginary components depend on G, $N_{sc}$, and $V_m$, knowledge of G and $V_m$ allows $N_{sc}$ and its dependence on the distance from the surface to be determined using Formulas E and F, above.

Figure 17:
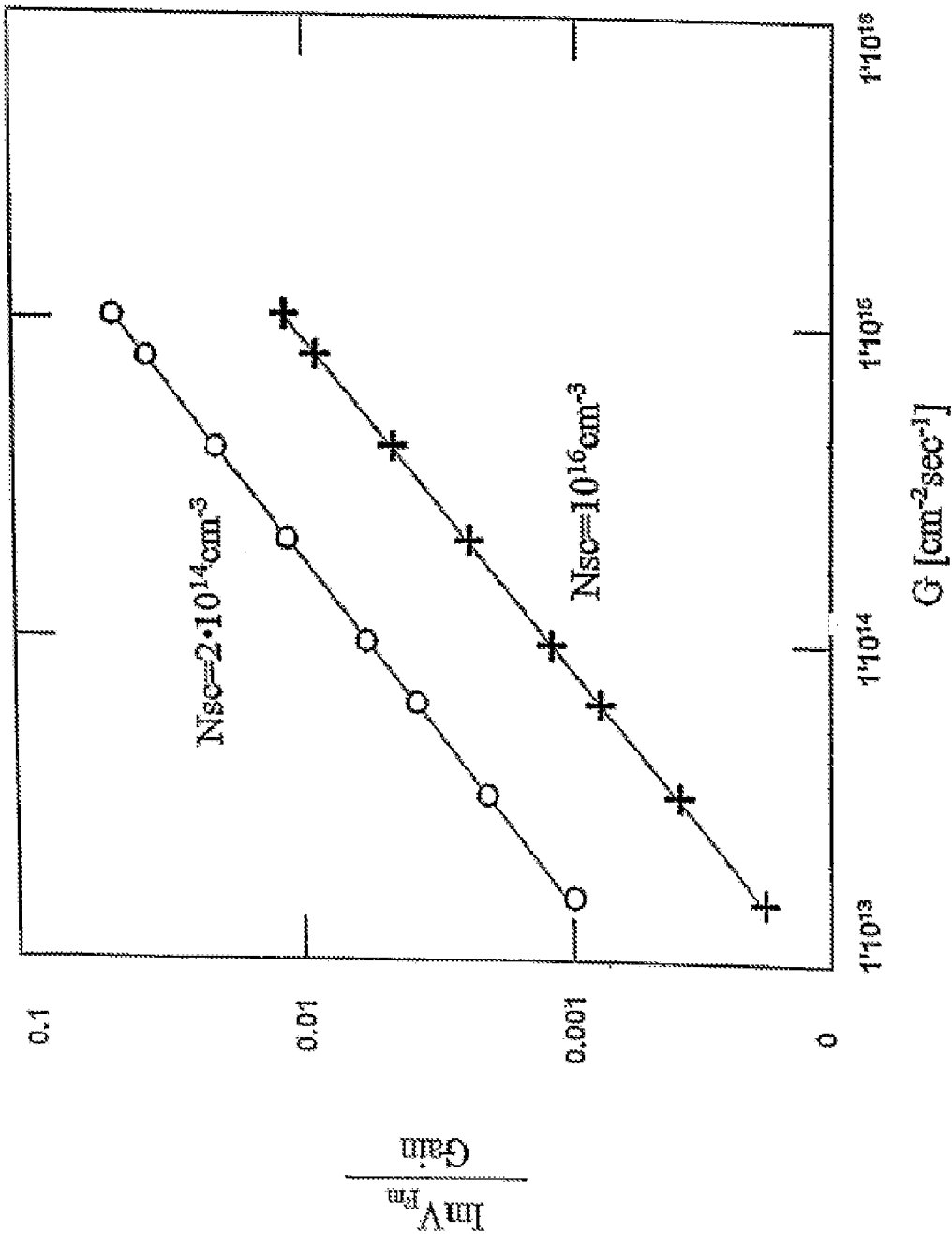
FIG. 17 graphically depicts the dependence of the measured AC-SPV signal on the optical generation rate for two calibration specimens, one having a doping concentration of about $10^{16}$ cm$^{-3}$ and the other having a doping concentration of about $2\times10^{14}$ cm$^{-3}$.
Figure 18:
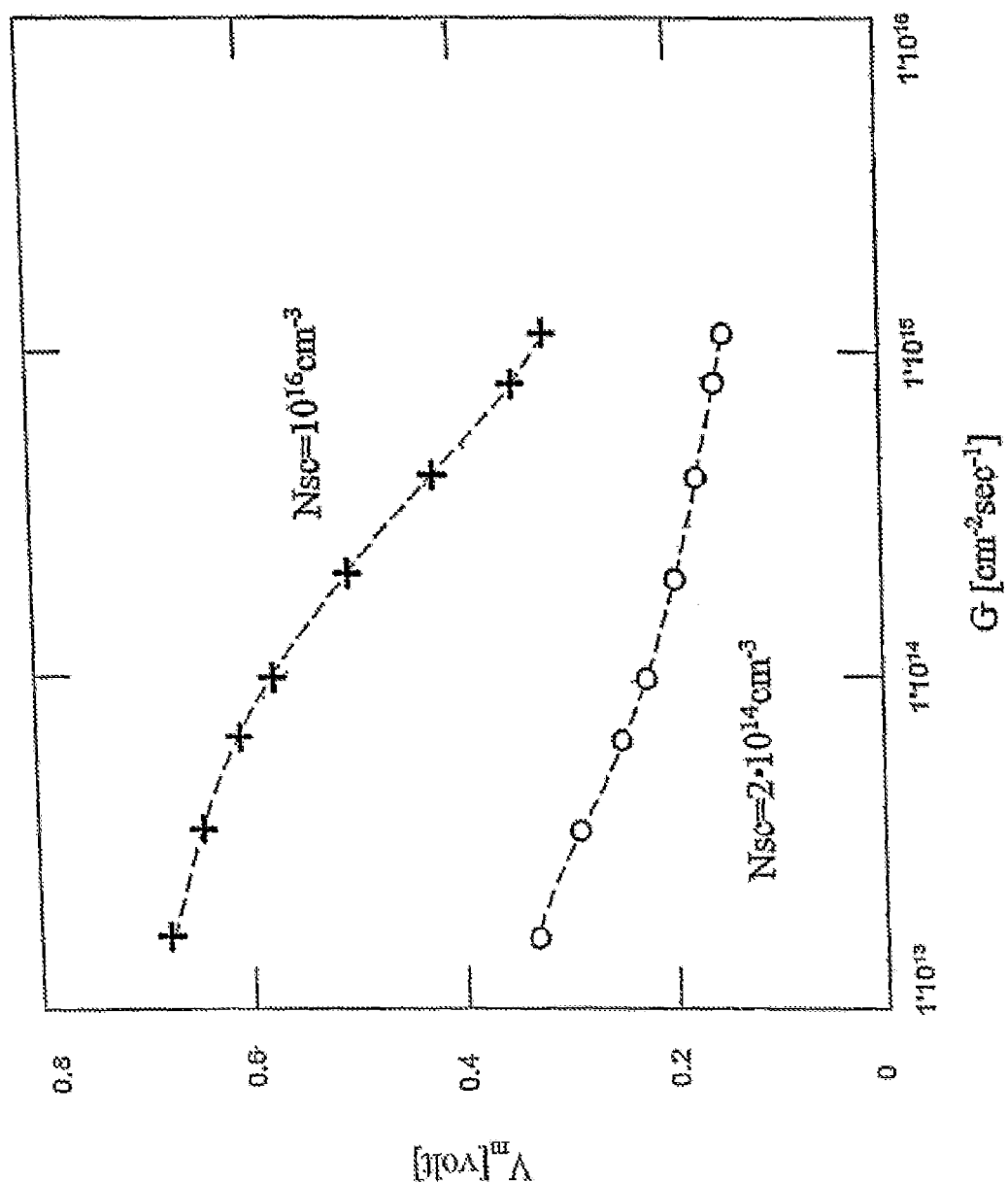
FIG. 18 graphically depicts dependence of surface potential barrier height on the optical generation rate for the specimen of FIG. 17.

One embodiment empirically determines the dependence of the height of the surface potential barrier, $V_m$, and generation rate, G, on the doping concentration, $N_{sc}$, employs a number of n-type calibration specimens of known, uniform doping concentration. These specimens should cover the entire $N_{sc}$ range of interest. Comparison of the relationship between the measured signal and the generation rate G for two of such calibration specimens is shown in FIG. 17. The dependence of the height of the surface potential barrier, $V_m$, on generation rate, G, may be established by matching the measured imaginary component with the imaginary component calculated using Formulas B and C above. A plot of this dependence is shown in FIG. 18.

In one embodiment, measurements for all specimens are performed at the same generation rates, G. From the set of measurements on calibration specimens of known and uniform doping concentration, dependence of $V_m$ on $N_{sc}$ is established for selected values of G. When measuring an unknown specimen, an approximate initial dopant concentration $N_{sc\_ini}$ and corresponding initial surface potential barrier height $V_{m\_ini}$ are used to match a calculated imaginary component to the measured imaginary component, divided by the system gain. If a difference between these values exceeds an acceptable maximum, the calculation is repeated with the new $N_{sc}$ and corresponding $V_m$. This procedure is repeated in an iterative fashion until the difference between the calculated imaginary component and the measured imaginary component divided by the system gain is no greater than the acceptable maximum.

Relying on a constant generation rate may require the electronic detection system (which comprises the amplifier 150 and controller 160) to have a large dynamic range. To reduce the dynamic range required, other approaches can be used. For example, the measured signal may be maintained substantially constant by adjusting the light intensity from the light source 110. The generation rate, G, for a range of light intensities may be empirically determined by measuring the light intensity as a function of power delivered to the light source 110 (or another factor used to vary intensity, e.g., the arrangement of neutral density filters) during calibration of the system 100. The height of the surface potential barrier, $V_m$, may be determined as outlined above, allowing calculation of the doping concentration, $N_{sc}$.

The preceding formulas are useful in connection with embodiments of the invention employing a light source with a single light emitter, e.g., the light source 210 of FIG. 5, which employs a single light emitter 222 that is 100% modulated, as shown in FIG. 6A. As noted above in connection with FIGS. 7, 8, and 9, other embodiments of the invention may employ two independently controllable light emitters 322 and 332. In such an embodiment, the generation rate G attributable to the modulated second light component 130 may be employed in the preceding equations. The specimen may also be illuminated with the non-modulated first light emitter 322. Adding the additional generation rate, $G_b$, attributable to this first light emitter 322, the equations for the imaginary component take the form:

$$\mathrm{Im}V_{Fi} = -\frac{kT}{2\pi q}\int_{-\pi}^{0}\ln\left[1 - a_i\exp\left(-\frac{\theta}{\omega\tau_i}\right)\right]\sin\theta d\theta - \frac{kT}{\pi q}\ln\left[\frac{G_b + G}{v_t N_{sc}} + \exp\left(-\frac{qV_{mo}}{kT}\right)\right],$$

$$\mathrm{Im}V_{Fd} = -\frac{kT}{2\pi q}\int_{0}^{\pi}\ln\left[1 - a_d\exp\left(-\frac{\theta}{\omega\tau_d}\right)\right]\sin\theta d\theta +$$
$$\frac{kT}{\pi q}\ln\left[\frac{G_b}{v_t N_{sc}} + \exp\left(-\frac{qV_{mo}}{kT}\right)\right].$$

The form of equations for the real component remains unchanged from those set forth above. Accordingly, the equations for determining the coefficients $a_i$, $a_d$, $\tau_i$, and $\tau_d$ in the imaginary and real component formulas above become:

$$a_i = 1 + \frac{\left[\frac{G}{v_t N_{sc}} + \exp\left(-\frac{qV_{mo}}{kT}\right)\right]\exp\left(-\frac{\pi}{\omega\tau_d}\right)\left[1 - \exp\left(-\frac{\pi}{\omega\tau_i}\right)\right]}{\left[\frac{G_b}{v_t N_{sc}} + \exp\left(-\frac{qV_{mo}}{kT}\right)\right]\left[\exp\left(-\frac{\pi}{\omega\tau_d} - \frac{\pi}{\omega\tau_i}\right) - 1\right]} +$$

$$\frac{\left[\frac{G_b + G}{v_t N_{sc}} + \exp\left(-\frac{qV_{mo}}{kT}\right)\right]\left[1 - \exp\left(-\frac{\pi}{\omega\tau_d}\right)\right]}{\left[\frac{G_b}{v_t N_{sc}} + \exp\left(-\frac{qV_{mo}}{kT}\right)\right]\left[\exp\left(-\frac{\pi}{\omega\tau_d} - \frac{\pi}{\omega\tau_i}\right) - 1\right]},$$

$$a_d = 1 - \frac{\left[\frac{G_b}{v_t N_{sc}} + \exp\left(-\frac{qV_{mo}}{kT}\right)\right]\left[1 - \exp\left(-\frac{\pi}{\omega\tau_i}\right)\right]}{\left[\frac{G_b + G}{v_t N_{sc}} + \exp\left(-\frac{qV_{mo}}{kT}\right)\right]\left[\exp\left(-\frac{\pi}{\omega\tau_d}\right) - \exp\left(-\frac{\pi}{\omega\tau_i}\right)\right]} -$$

$$\frac{\left[\frac{G_b + G}{v_t N_{sc}} + \exp\left(-\frac{qV_{mo}}{kT}\right)\right]\left[1 - \exp\left(-\frac{\pi}{\omega\tau_d}\right)\right]}{\left[\frac{G_b + G}{v_t N_{sc}} + \exp\left(-\frac{qV_{mo}}{kT}\right)\right]\left[\exp\left(-\frac{\pi}{\omega\tau_d}\right) - \exp\left(-\frac{\pi}{\omega\tau_i}\right)\right]},$$

$$\tau_i = \left\{\frac{q}{kT}\left[v_t N_{sc}\exp\left(-\frac{qV_{mo}}{kT}\right) + G_b + G\right]\sqrt{\frac{2qV_m}{\varepsilon_s N_{sc}}}\right\}^{-1},$$

$$\tau_d = \left\{\frac{q}{kT}\left[v_t N_{sc}\exp\left(-\frac{qV_{mo}}{kT}\right) + G_b\right]\sqrt{\frac{2qV_m}{\varepsilon_s N_{sc}}}\right\}^{-1}.$$

The gain of the signal amplification channel may be measured using essentially the same process detailed above by turning off the first light emitter 222, which will set $G_{b=0}$. The remaining measurements and the calibration procedure may be performed, e.g., at constant $\tau_i$ and variable G, or at constant G and variable $\tau_i$.

Conclusion

Embodiments of the invention, therefore, permit characterization of very thin near-surface regions of semiconductors using a non-contact approach that will not damage the measured specimen. For example, embodiments of the invention may be able to reliably and reproducibly measure dopant concentrations or other electrical characteristics in near-surface regions having a width of 600 nm or less, e.g., no more than 300 nm, for a p-type semiconductor having a dopant concentration of about $10^{15}$ cm$^{-3}$, for example. In select embodiments of the invention, it is anticipated that the characterized depth of a p-type semiconductor having a dopant concentration of about $10^{15}$ cm$^{-3}$ may be about 100 nm or less. Although results may vary somewhat depending on the structural and material characteristics of a specimen, conventional SPV-based characterization of semiconductors typically cannot reliably measure characteristics of layers having a thickness more than 1-10% below the maximum equilibrium depletion layer is width $D_0$, which will be about 1 μm for a p-type semiconductor with a dopant concentration of about $10^{15}$ cm$^{-3}$. C-V measurement techniques are typically limited to layers that are at least about 500 nm thick for the same p-type specimen with a $10^{15}$ cm$^{-3}$ dopant concentration.

Further embodiments of the invention are capable of generating a dopant concentration profile using a non-destructive, non-contact approach. This can facilitate detailed analysis of semiconductor workpieces at one or more stages in a manufacturing operation, e.g., by measuring semiconductor wafers between two or more steps in the manufacture of integrated circuits or other surface structures. The resultant analysis will help identify defective products at an early stage in a manufacturing process, saving the sometimes-considerable expense of completing the remaining steps to produce an ultimately defective product. Neither conventional, low-intensity SPV nor CV approaches offer the ability to determine a dopant concentration profile of thin films, e.g., layers less than 300 nm thick at a dopant concentration of about $10^{15}$ cm$^{-3}$, analogous to that achieved with embodiments of the invention.

The above-detailed embodiments and examples are intended to be illustrative, not exhaustive, and those skilled in the art will recognize that various equivalent modifications are possible within the scope of the invention. For example, whereas steps are presented in a given order, alternative embodiments may perform steps in a different order. The various embodiments described herein can be combined to provide further embodiments. Each of the identified patents and each of the identified non-patent references (either in the Bibliography or elsewhere) are incorporated herein, in their entirety, by reference.

In general, the terms used in the following claims should not be construed to limit the invention to the specific embodiments disclosed in the specification unless the preceding description explicitly defines such terms. The inventors reserve the right to add additional claims after filing the application to pursue additional claim forms for other aspects of the invention.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of characterizing an aspect of a semiconductor specimen, comprising:
    illuminating a target area of a surface of the specimen with light, the light having a first component and a second component, at least the second component being intensity modulated;
    measuring a first AC voltage signal induced in the specimen by the light, the first AC voltage signal being associated with an aspect of a first near-surface region of the specimen having a first depth;
    changing an intensity of the first component of the light to generate modified light;
    illuminating the target area of the specimen surface with the modified light; and
    measuring a second AC voltage signal induced in the specimen by the modified light, the second AC voltage signal being associated with the aspect of a second near-surface region of the specimen having a second depth that is different from the first depth.

2. The method of claim 1 further comprising determining a first doping concentration in the first near-surface region of the specimen using the first AC voltage signal and determining a second doping concentration in the second near-surface region of the specimen using the second AC voltage signal.

3. The method of claim 1 wherein the difference between the first and second regions defines a third region, the method further comprising:
    determining a first doping concentration in the first near-surface region of the specimen using the first AC voltage signal;
    determining a second doping concentration in the second near-surface region of the specimen using the second AC voltage signal; and
    comparing the first doping concentration to the second doping concentration to determine a doping concentration of the third region.

4. The method of claim 1 wherein the modified light is a first modified light, the method further comprising:
    changing an intensity of the first component of the light to generate a second modified light, the intensity of the first component differing in the first and second modified lights;
    illuminating the target area of the specimen surface with the second modified light;
    measuring a third AC voltage signal induced in the specimen by the second modified light, the third AC voltage signal being associated with the aspect of a third near-surface region of the specimen having a third depth that is different from the first depth and from the second depth;
    determining a first doping concentration in the first near-surface region of the specimen using the first AC voltage signal;
    determining a second doping concentration in the second near-surface region of the specimen using the second AC voltage signal; and
    determining a third doping concentration in the third near-surface region of the specimen using the third AC voltage signal.

5. The method of claim 1 wherein the light is monochromatic and has a wavelength that is shorter than a wavelength corresponding to an energy gap of the target area of the semiconductor specimen.

6. The method of claim 1 wherein the first component of the light is generated, at least in part, by a first light emitter and the second component of the light is generated by a second light emitter.

7. The method of claim 1 wherein the first component of the light is not intensity modulated.

8. The method of claim 1 wherein the first component of the light is generated, at least in part, by a first light emitter and has a first wavelength and the second component of the light is generated by a second light emitter and has a second wavelength.

9. The method of claim 8 wherein the first wavelength is substantially the same as the second wavelength.

10. The method of claim 1 wherein the first and second components of the light are generated by a common light emitter.

11. The method of claim 1 wherein the first component of the light comprises an average intensity of the intensity modulated second component.

12. The method of claim 11 wherein the first component further comprises an intensity that is controllable independently of the second component.

13. The method of claim 1 wherein the first component illuminates a surface area at least as great as a surface area illuminated by the second component.

14. The method of claim 13 wherein the first component illuminates a surface area that is greater than and encompasses a surface area illuminated by the second component.

15. The method of claim 1 wherein the light further comprises a third component, the third component illuminating a surface area that substantially encircles a surface area illuminated by the second component, the intensity and wavelength of the second component and the intensity and wavelength of the third component being selected such that a surface potential in the area illuminated by the second component is less than a surface potential in the area illuminated by the third component.

16. The method of claim 15 wherein the first and second components of the light are generated by a common light emitter.

17. The method of claim 1 further comprising determining whether a distance between a pick-up electrode and the specimen surface is within an acceptable range.

* * * * *